(12) United States Patent
Nakanishi et al.

(10) Patent No.: US 8,466,566 B2
(45) Date of Patent: Jun. 18, 2013

(54) SEMICONDUCTOR DEVICE, METHOD FOR MANUFACTURING OF SEMICONDUCTOR DEVICE, AND SWITCHING CIRCUIT

(75) Inventors: Makoto Nakanishi, Miyagi (JP); Tomoo Yamanouchi, Miyagi (JP); Junichi Okayasu, Miyagi (JP); Taku Sato, Miyagi (JP); Daiju Terasawa, Miyagi (JP); Masahiko Takikawa, Kanagawa (JP)

(73) Assignee: Advantest Corporation, Tokyo (JP)

( * ) Notice: Subject to any disclaimer, the term of this patent is extended or adjusted under 35 U.S.C. 154(b) by 332 days.

(21) Appl. No.: 13/077,999

(22) Filed: Apr. 1, 2011

(65) Prior Publication Data

US 2012/0074577 A1    Mar. 29, 2012

Related U.S. Application Data

(63) Continuation of application No. PCT/JP2009/006470, filed on Nov. 30, 2009.

(30) Foreign Application Priority Data

Dec. 19, 2008   (JP) ................................ 2008-324787

(51) Int. Cl.
*H01L 23/52*    (2006.01)
*H01L 23/48*    (2006.01)
*H01L 29/40*    (2006.01)

(52) U.S. Cl.
USPC ...... 257/786; 257/E23.01; 257/780; 257/781; 438/612; 438/666

(58) Field of Classification Search
USPC .................... 257/E23.01, E21.158, 491, 700, 257/773, 775, 776, 778–781, 784, 786; 438/118, 438/612, 617, 666
See application file for complete search history.

(56) References Cited

U.S. PATENT DOCUMENTS 5,455,460 A * 10/1995 Hongo et al. .................. 257/734
5,818,114 A * 10/1998 Pendse et al. .................. 257/786

(Continued)

FOREIGN PATENT DOCUMENTS

JP    62-093970 A    4/1987
JP    06-338520 A    12/1994

(Continued)

OTHER PUBLICATIONS

International Search Report (ISR) for International application No. PCT / JP2009 / 006470 with a completion date of Feb. 19, 2010.

(Continued)

*Primary Examiner* — Chris Chu

(57) ABSTRACT

It is an objective to provide a semiconductor device with low leak current. The semiconductor device includes a plurality of ground side electrodes and a plurality of signal side electrodes arranged on a semiconductor substrate in an alternating manner; a plurality of control electrodes arranged respectively between each pair of a ground side electrode and a signal side electrode; a ground side electrode connecting section that connects the ground side electrodes to each other; a signal side electrode connecting section that connects the signal side electrodes to each other; and ground side lead wiring and signal side lead wiring that extend respectively from a region near one end and a region near another end of an arranged electrode section, in which the ground side electrodes and the signal side electrodes are arranged in an arrangement direction, away from the arranged electrode group in the arrangement direction.

9 Claims, 19 Drawing Sheets

U.S. PATENT DOCUMENTS

| | | | | |
|---|---|---|---|---|
| 6,121,690 | A * | 9/2000 | Yamada et al. | 257/784 |
| 6,242,814 | B1 * | 6/2001 | Bassett | 257/786 |
| 6,410,990 | B2 * | 6/2002 | Taylor et al. | 257/786 |
| 6,476,505 | B2 * | 11/2002 | Nakamura | 257/786 |
| 6,538,336 | B1 * | 3/2003 | Secker et al. | 257/786 |
| 6,590,296 | B2 * | 7/2003 | Nakamura | 257/786 |
| 6,713,881 | B2 * | 3/2004 | Umehara et al. | 257/786 |
| 6,900,551 | B2 * | 5/2005 | Matsuzawa et al. | 257/786 |
| 7,071,561 | B2 * | 7/2006 | Chen | 257/758 |
| 7,088,009 | B2 * | 8/2006 | Hagen | 257/786 |
| 7,514,800 | B2 * | 4/2009 | Kida | 257/784 |
| 7,528,484 | B2 * | 5/2009 | Rakshani | 257/724 |
| 7,538,441 | B2 * | 5/2009 | Inagawa | 257/784 |
| 7,808,117 | B2 * | 10/2010 | Vo et al. | 257/786 |
| 8,227,917 | B2 * | 7/2012 | Hsu et al. | 257/738 |
| 2004/0188848 | A1 * | 9/2004 | Nojiri et al. | 257/773 |
| 2005/0179472 | A1 * | 8/2005 | Nakamura et al. | 327/109 |
| 2007/0063307 | A1 * | 3/2007 | Nakamura et al. | 257/491 |
| 2007/0111376 | A1 * | 5/2007 | Pendse | 438/106 |

FOREIGN PATENT DOCUMENTS

| | | |
|---|---|---|
| JP | 2000-100832 A | 4/2000 |
| JP | 2005-203766 A | 7/2005 |
| JP | 2008-258419 A | 10/2008 |
| JP | 2009-044085 A | 2/2009 |

OTHER PUBLICATIONS

Ishida, et al., "A High-Power RF Switch IC Using AlGaNlGaN HFETs With Single-Stage Configuration" IEEE Transactions on Electron Devices; vol. 52; No. 8; Aug. 2005. p. 1893-1899.

Ohno, "Current status and prospects of GaN-based high-frequency devices" FED Review vol. 1; No. 13; Mar. 14, 2002. p. 1-12.

Demchuk, et al., "MOCVD AlGaN/GaN HFET's Material Optimization and Devices Characterization" APA Optics, Inc., 2950 NE 84th Lane, Blaine, MN 55449, U.S.A. (2003).

Nakajima, "Recent Development of High Power Field Effect Transistors" Bulletin of the Institute of Electronics, Information and Communication Engineers, pp. 424-432, Japan (May 2004).

Itoh Masanori et al., Oki Technical Review, Issue 203, vol. 72, No. 3, pp. 60-63, Jul. 2005, Japan.

Written Opinion (PCT/ISA/237) issued in PCT/JP2009/006470 (parent application) mailed on Jul. 14, 2011.

Preliminary Notice of First Office Action dated Jan. 22, 2013 issued by the Taiwan Intellectual Property Office.

* cited by examiner

SEMICONDUCTOR DEVICE, METHOD FOR MANUFACTURING OF SEMICONDUCTOR DEVICE, AND SWITCHING CIRCUIT

BACKGROUND

1. Technical Field

The present invention relates to a semiconductor device, a method of manufacturing the semiconductor device, and a switching circuit.

2. Related Art

A high electron mobility transistor (HEMT) using a compound semiconductor can operate at higher speeds than a silicon device. Because of this feature, an HEMT can be used as a device in a high-frequency switch (referred to hereinafter as an "RF switch"). Furthermore, the increasing frequencies of high-frequency switches have led to the development of HEMTs using comb-shaped gate electrodes.

For example, Non-Patent Document 1 discloses an HEMT in which source electrodes and drain electrodes are arranged in an alternating manner, and a gate electrode is disposed between each pair of a source electrode and a drain electrode. Furthermore, the HEMT of Non-Patent Document 1 includes a source side electrode pad and a drain side electrode pad that extend in the direction of the channel length, and the source electrodes and drain electrodes are arranged between the source side electrode pad and the drain side electrode pad. In the HEMT of Non-Patent Document 1, the source side electrode pad, the source electrode, the drain electrode, and the drain side electrode pad are arranged in the channel width direction in the stated order (see Non-Patent Documents 1 and 2).

Non-Patent Document 1: OHNO Yasuo, FED review, vol. 1, No. 13, pp. 7-8, Mar. 14, 2002.
Non-Patent Document 2: ITOH Masanori et al., Oki Technical Review, Issue 203, vol. 72, No. 3, pp. 61-62, July 2005.

In the HEMT of Non-Patent Document 1, since the source side electrode pad, the source electrode, the drain electrode, and the drain side electrode pad are arranged in the stated order in the channel width direction, small leak currents occur between the source side electrode pad and the drain electrode and between the drain side electrode pad and the source electrode. A leak current also occurs between the gate electrode and the electrode pads. However, HEMTs are used as DC switches as well as RF switches, and in this case, the leak current occurring when OFF cannot be ignored. Therefore a semiconductor device with a small leak current is desired.

SUMMARY

Therefore, it is an object of an aspect of the innovations herein to provide a test module and a test method, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, provided is a semiconductor device comprising a plurality of ground side electrodes and a plurality of signal side electrodes arranged on a semiconductor substrate in an alternating manner; a plurality of control electrodes arranged respectively between each pair of a ground side electrode and a signal side electrode; a ground side electrode connecting section that connects the ground side electrodes to each other; a signal side electrode connecting section that connects the signal side electrodes to each other; and ground side lead wiring and signal side lead wiring that extend respectively from a region near one end and a region near another end of an arranged electrode section, in which the ground side electrodes and the signal side electrodes are arranged in an arrangement direction, away from the arranged electrode group in the arrangement direction.

In the semiconductor device the ground side lead wiring may be adjacent to a ground side electrode, from among the plurality of ground side electrodes, that is closest to the ground side lead wiring, and the signal side lead wiring may be adjacent to a signal side electrode, from among the plurality of signal side electrodes, that is closest to the signal side lead wiring. The ground side electrode connecting section may lessen concentration of electric fields in the control electrodes. The ground side electrode connecting section may have a width greater than a width of the signal side electrode connecting section.

In the semiconductor device, the ground side electrode connecting section may be formed above ends, in a width direction of the control electrodes, of the ground side electrodes, the signal side electrodes, and the control electrodes. The ground side electrode connecting section may be formed above both ends, in the width direction of the control electrodes, of the ground side electrodes and the signal side electrodes. Leak current per 1 mm of gate width may be no greater than 500 pA, and ON resistance may be no greater than 2 Ωmm.

According to a second aspect related to the innovations herein, provided is a semiconductor device manufacturing method comprising preparing a semiconductor substrate; forming, on the semiconductor substrate, a plurality of ground side electrodes and a plurality of signal side electrodes arranged in an alternating manner; forming an insulating layer on a surface of the semiconductor substrate, at least in a region between each pair of a ground side electrode and a signal side electrode; forming a plurality of control electrodes arranged on the insulating layer respectively between each pair of a ground side electrode and a signal side electrode; forming a ground side electrode connecting section that connects the ground side electrodes to each other; forming a signal side electrode connecting section that connects the signal side electrodes to each other; and forming ground side lead wiring and signal side lead wiring that extend respectively from a region near one end and a region near an other end of an arranged electrode section, in which the ground side electrodes and the signal side electrodes are arranged in an arrangement direction, away from the arranged electrode group in the arrangement direction.

According to a third aspect related to the innovations herein, provided is a switching circuit comprising a semiconductor device that operates as a switching element. The semiconductor device includes a plurality of ground side electrodes and a plurality of signal side electrodes arranged on a semiconductor substrate in an alternating manner; a plurality of control electrodes arranged respectively between each pair of a ground side electrode and a signal side electrode; a ground side electrode connecting section that connects the ground side electrodes to each other; a signal side electrode connecting section that connects the signal side electrodes to each other; and ground side lead wiring and signal side lead wiring that extend respectively from a region near one end and a region near an other end of an arranged electrode section, in which the ground side electrodes and the signal side electrodes are arranged in an arrangement direction, away from the arranged electrode group in the arrangement direction.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
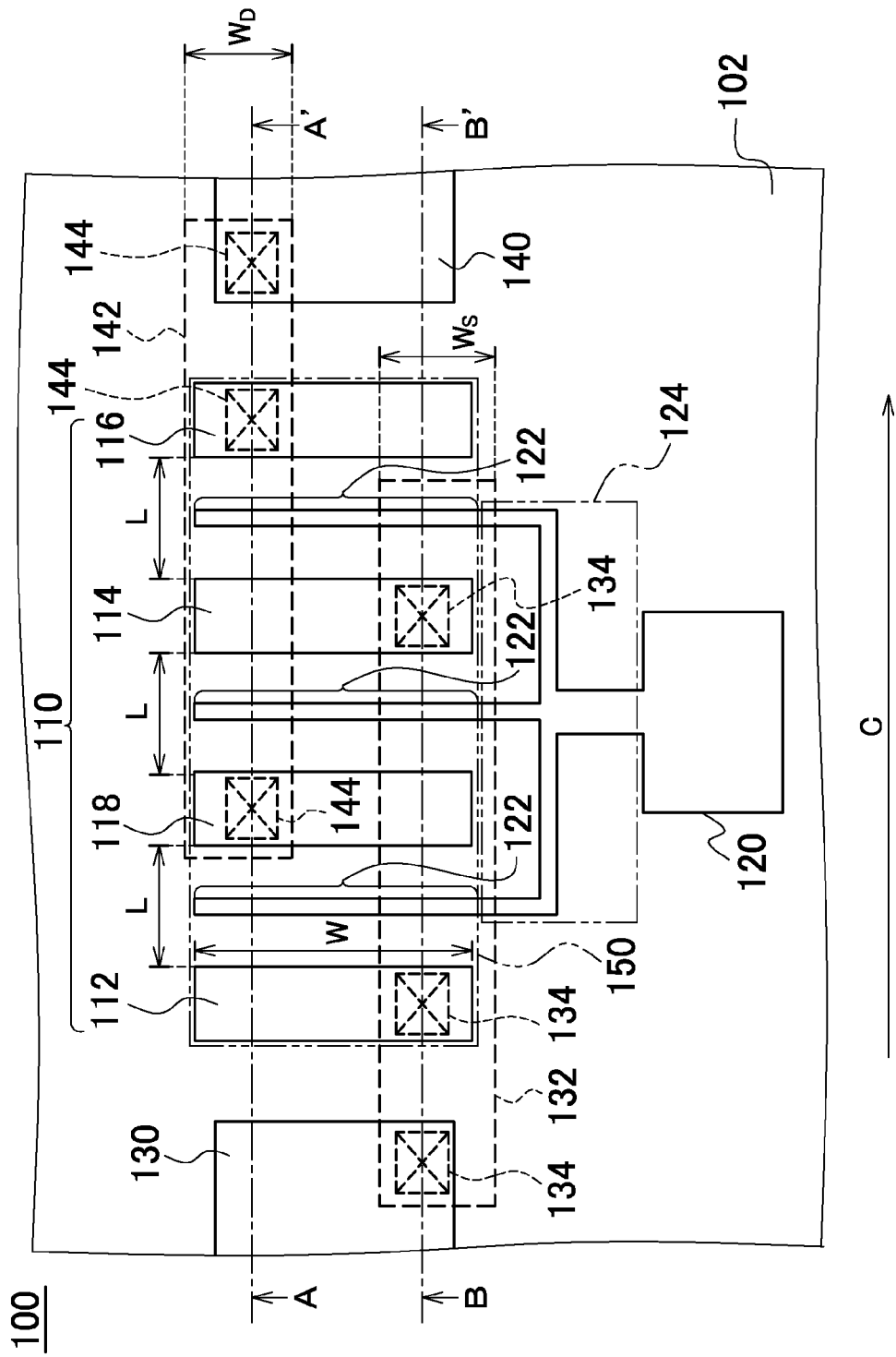
FIG. 1 schematically shows an exemplary planar view of a HEMT 100.

FIG. 1 schematically shows an exemplary planar view of a HEMT 100. The HEMT 100 is an example of a semiconductor device. FIG. 1 shows an enlarged view of the HEMT 100 formed on a substrate 102. As shown in FIG. 1, the HEMT 100 may include an arranged electrode group 110, gate electrode lead wiring 120, gate electrodes 122, a gate electrode connecting section 124, source electrode lead wiring 130, a source electrode connecting section 132, plugs 134, drain electrode lead wiring 140, a drain electrode connecting section 142, and plugs 144.

The arranged electrode group 110 may include a source electrode 112 and a source electrode 114, as well as a drain electrode 116 and a drain electrode 118. At least a portion of the arranged electrode group 110 is formed on a non-element-isolation region 150 of the substrate 102. The substrate 102 is an example of a semiconductor substrate.

As shown in FIG. 1, in the present embodiment, the source electrode lead wiring 130, the arranged electrode group 110, and the drain electrode lead wiring 140 are arranged in the direction in which the electrodes forming the arranged electrode group 110 are arranged, and this direction is referred to as the "arrangement direction C." Compared to arranging the source electrode lead wiring 130, the arranged electrode group 110, and the drain electrode lead wiring 140 in a direction perpendicular to the arrangement direction C, the above arrangement achieves a greater distance between each electrode of the arranged electrode group 110 and the source electrode lead wiring 130 or the drain electrode lead wiring 140. As a result, the leak current can be reduced.

In the present embodiment, the source electrode connecting section 132, the drain electrode connecting section 142, the plugs 134, and the plugs 144 are not formed in the same plane as the arranged electrode group 110, the gate electrode 122, the gate electrode connecting section 124, the source electrode lead wiring 130, and the drain electrode lead wiring 140. Therefore, in FIG. 1, the source electrode connecting section 132, the drain electrode connecting section 142, the plugs 134, and the plugs 144 are shown by dotted lines. Furthermore, in FIG. 1, the arranged electrode group 110 is shown by a semi-dashed line surrounding the source electrode 112, the source electrode 114, the drain electrode 116, and the drain electrode 118.

Figure 2:
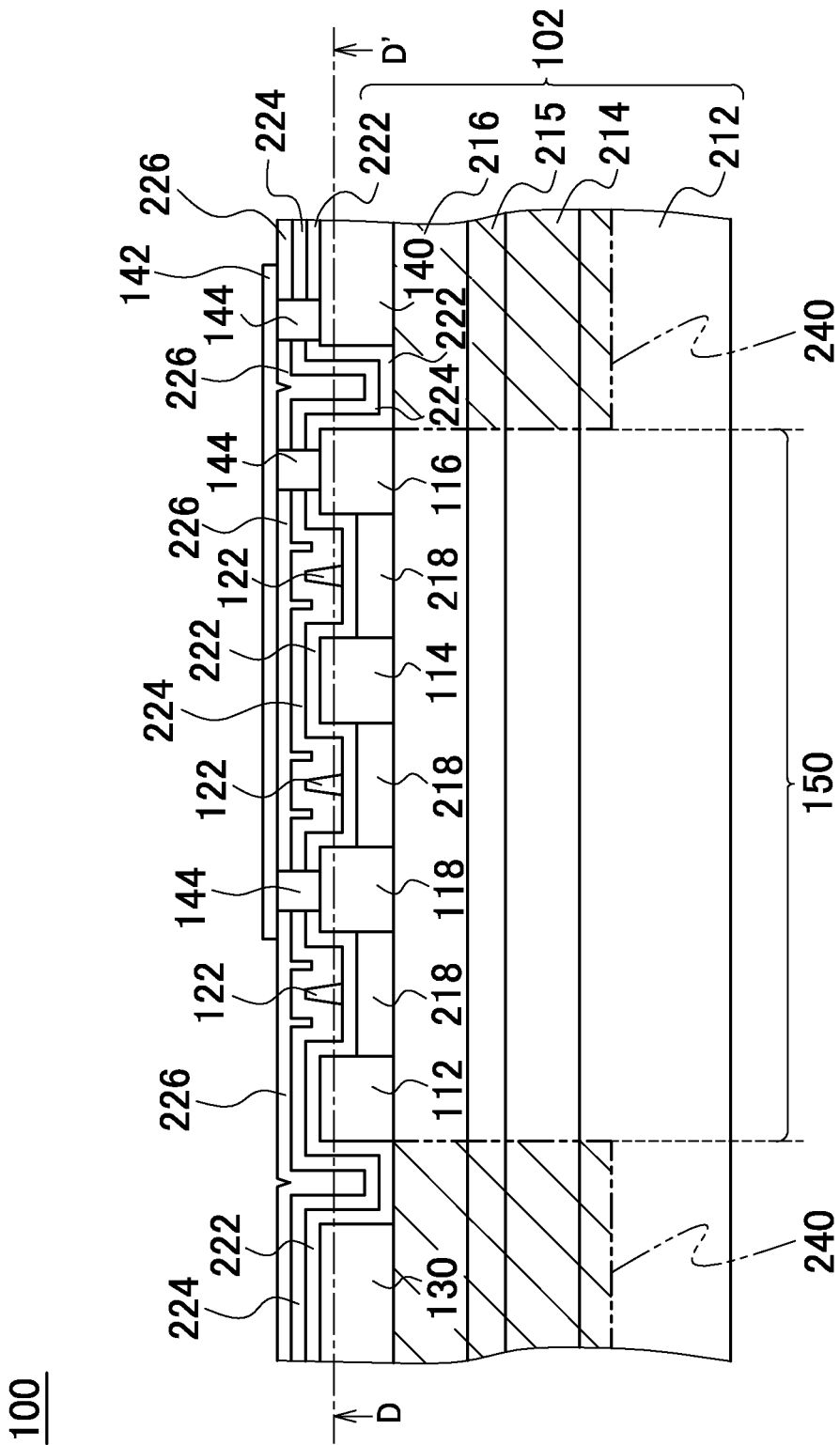
FIG. 2 schematically shows an exemplary cross-sectional view of a HEMT 100.

FIG. 2 schematically shows an exemplary cross section of the HEMT 100. FIG. 2 schematically shows the cross section over the line A-A' in FIG. 1. As shown in FIG. 2, the HEMT 100 may include a substrate 102, an insulating layer 222, an insulating layer 224, and a protective layer 226.

The substrate 102 may include a support substrate 212, a channel layer 214, a spacer layer 215, a carrier supply layer 216, and a cap layer 218. The substrate 102 may include an element isolation region 240 that electrically isolates the HEMT 100 from other electronic elements. These electronic elements may be active elements such as transistors, or passive elements such as capacitors, resistors, and coils. A portion of the cap layer 218 may be patterned by etching.

As shown in FIG. 2, the drain electrode 116, the drain electrode 118, and the drain electrode lead wiring 140 are electrically connected to the drain electrode connecting section 142 via the plugs 144. As a result, the drain electrode 116, the drain electrode 118, and the drain electrode lead wiring 140 are electrically connected to each other via the drain electrode connecting section 142 and the plugs 144.

Figure 3:
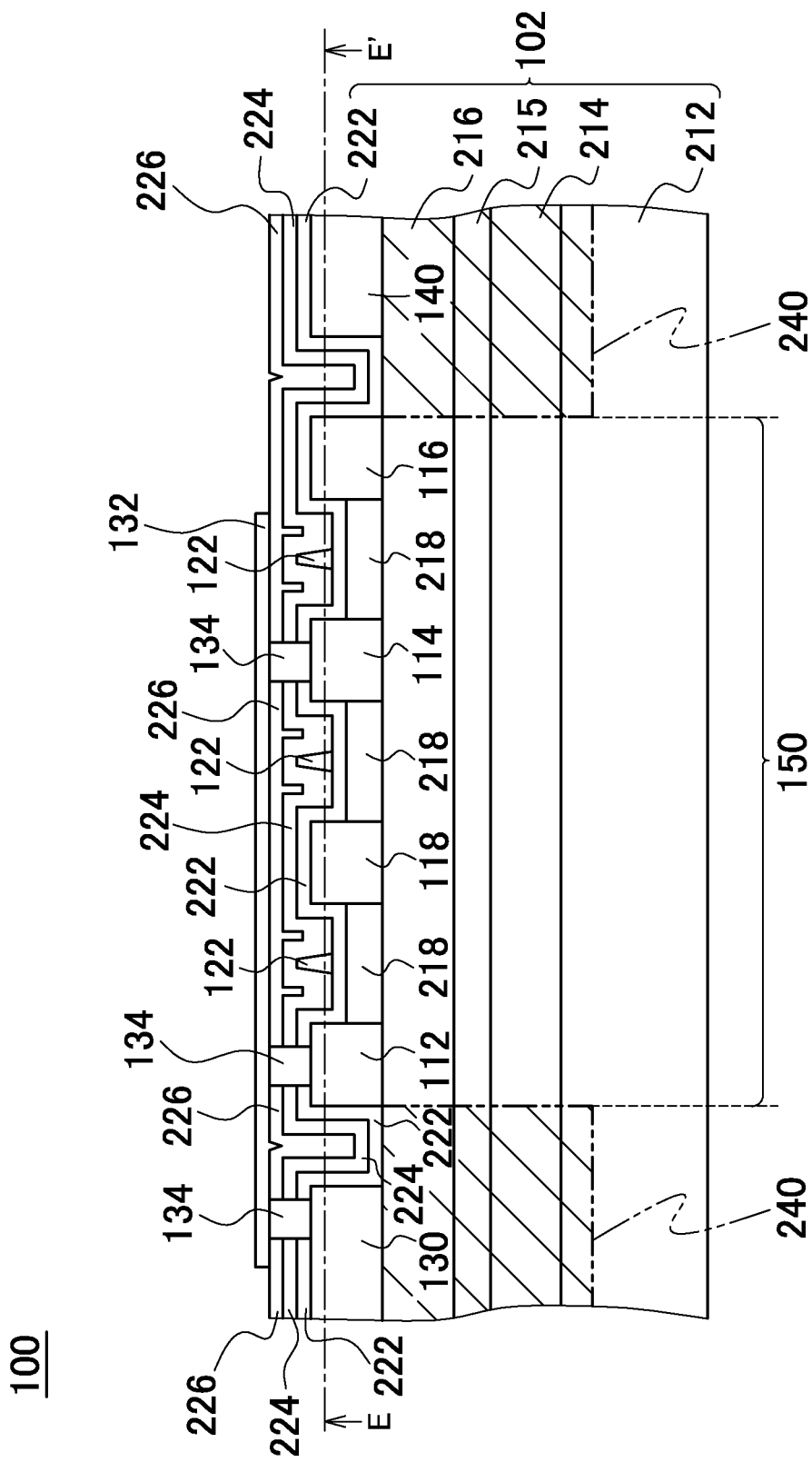
FIG. 3 schematically shows an exemplary cross-sectional view of a HEMT 100.

FIG. 3 schematically shows an exemplary cross section of the HEMT 100. FIG. 3 schematically shows the cross section over the line B-B' in FIG. 1. As shown in FIG. 3, the source electrode 112, the source electrode 114, and the source electrode lead wiring 130 may be electrically connected to the source electrode connecting section 132 via the plugs 134. As a result, the source electrode 112, the source electrode 114, and the source electrode lead wiring 130 are electrically connected to each other via the source electrode connecting section 132 and the plugs 134.

FIG. 1 schematically shows a cross section over the line D-D' in FIG. 2 or the line E-E' in FIG. 3. For ease of explanation, in FIG. 1, the insulating layer 222, the insulating layer 224, and the protective layer 226 are not shown. Furthermore, the carrier supply layer 216 and the cap layer 218 are shown together as the substrate 102. For ease of explanation, the drain electrode connecting section 142 is not shown in FIG. 3. The following provides a detailed description of the HEMT 100 using FIGS. 1 to 3.

The arranged electrode group 110 is formed on the substrate 102. The arranged electrode group 110 is an example of an arranged electrode section. The arranged electrode group 110 may include the source electrode 112, the drain electrode 118, the source electrode 114, and the drain electrode 116 in the stated order beginning on the side thereof near the source electrode lead wiring 130. The source electrode 112, the drain electrode 118, the source electrode 114, and the drain electrode 116 may be arranged at uniform intervals. The intervals between the source electrodes and drain electrodes arranged alternately on the substrate 102 may be from 2 μm to 5 μm, for example. The planar shape of each source electrode and drain electrode may be a rectangle in which length in a channel width direction is from 100 μm to 500 μm and length in a channel length direction is from 10 μm to 20 μm, for example.

Channels of the HEMT 100 are formed between adjacent pairs of source electrodes and drain electrodes. For example, channel regions that each have a channel length L and a channel width W may be respectively formed between the source electrode 112 and the drain electrode 118, between the drain electrode 118 and the source electrode 114, and between the source electrode 114 and the drain electrode 116. The arrangement direction C in which the electrodes forming the arranged electrode group 110 are arranged may be parallel to the channel length direction of the channel regions.

In the present embodiment, the arranged electrode group 110, the source electrode lead wiring 130, and the drain electrode lead wiring 140 contact the carrier supply layer 216. When the arranged electrode group 110, the source electrode lead wiring 130, and the drain electrode lead wiring 140 are formed in contact with the substrate 102 in this way, the arranged electrode group 110 may be formed between the source electrode lead wiring 130 and the drain electrode lead wiring 140.

The positional relationship between the arranged electrode group 110, the source electrode lead wiring 130, and the drain electrode lead wiring 140 is not limited to this. For example, if an insulating layer is arranged between (i) the source electrode lead wiring 130 and the drain electrode lead wiring 140 and (ii) the substrate 102 and the arranged electrode group 110, the source electrode lead wiring 130 and the drain electrode lead wiring 140 may be formed above the arranged electrode group 110 to cover the arranged electrode group 110 via the insulating layer.

The source electrode 112, the source electrode 114, the drain electrode 116, and the drain electrode 118 form the input/output electrodes of the HEMT 100. The source electrode 112 and the source electrode 114 are examples of ground side electrodes. The drain electrode 116 and the drain electrode 118 are examples of signal side electrodes. The source electrode 112, the source electrode 114, the drain electrode 116, and the drain electrode 118 may contact the carrier supply layer 216. The source electrode 112, the source electrode 114, the drain electrode 116, and the drain electrode 118 may be in ohmic contact with the carrier supply layer 216.

The source electrode 112, the source electrode 114, the drain electrode 116, and the drain electrode 118 may include transition metals such as Ni, Au, Ti, W, and Al. The source electrode 112, the source electrode 114, the drain electrode 116, and the drain electrode 118 may be alloys of the above metals, or may have layered structures including layers of alloys including the above metals.

The gate electrode lead wiring 120 may be at least a portion of the terminals of the HEMT 100 connected to the outside.

The gate electrode lead wiring 120 may be electrically connected to an external power source. The gate electrode lead wiring 120 may be electrically connected to the gate electrodes 122. The gate electrode lead wiring 120 may include Au, Ni, Pt, or W. The gate electrode lead wiring 120 may be an alloy of the above metals, or may have a layered structure including layers of alloys including the above metals.

The gate electrodes 122 may be disposed respectively between the source electrode 112 and the drain electrode 118, between the drain electrode 118 and the source electrode 114, and between the source electrode 114 and the drain electrode 116. The gate electrodes 122 are examples of control electrodes. Each gate electrode 122 is electrically connected to the gate electrode lead wiring 120. Therefore, when voltage is applied to the gate electrode 122 arranged between the source electrode 112 and the drain electrode 118, for example, the current between the source electrode 112 and the drain electrode 118 can be suppressed.

The planar shape of each gate electrode 122 may be a rectangle in which length in the channel width direction (referred to hereinafter as "gate width") is from 100 μm to 500 μm and length in the channel length direction (referred to hereinafter as "gate length") is from 0.5 μm to 1.5 μm. The gate electrodes 122 may be formed using the same material as the gate electrode lead wiring 120.

The gate electrode connecting section 124 electrically connects the gate electrode lead wiring 120 and the gate electrodes 122. The gate electrode connecting section 124 may be formed using the same material as the gate electrode lead wiring 120. The gate electrode lead wiring 120, the gate electrodes 122, and the gate electrode connecting section 124 may be formed integrally.

The source electrode lead wiring 130 may be at least a portion of the terminals of the HEMT 100 connected to the outside. The source electrode lead wiring 130 may be an electrode pad, or may be lead wiring connected to an electrode pad. The reference voltage of the HEMT 100 may be applied to the source electrode lead wiring 130. The source electrode lead wiring 130 is electrically connected to the source electrode 112 and the source electrode 114. The source electrode lead wiring 130 may be formed using the same material as the source electrode 112 and the source electrode 114.

The arranged electrode group 110 and the source electrode lead wiring 130 may be arranged in the channel length direction of the channel regions formed in the arranged electrode group 110. For example, the source electrode lead wiring 130 may extend away from the arranged electrode group 110, from one end of the arranged electrode group 110 in the arrangement direction C. At least a portion of the source electrode lead wiring 130 may extend in a direction substantially parallel to the arrangement direction C. As a result, compared to arranging the arranged electrode group 110 and the source electrode lead wiring 130 in the channel width direction of the channel regions, the above arrangement can achieve a lower leak current between the arranged electrode group 110 and the source electrode lead wiring 130.

The source electrode lead wiring 130 may be arranged adjacent to the source electrode 112. In this way, the source electrode lead wiring 130 can be arranged adjacent to the source electrode, from among the plurality of source electrodes, that is closest to the source electrode lead wiring 130. As a result, compared to arranging the source electrode lead wiring 130 adjacent to a drain electrode included in the arranged electrode group 110, the above arrangement can achieve a lower leak current between the arranged electrode group 110 and the source electrode lead wiring 130.

The source electrode connecting section 132 is electrically connected to the source electrode 112, the source electrode 114, and the source electrode lead wiring 130. The source electrode connecting section 132 may be electrically connected to the source electrode 112, the source electrode 114, or the source electrode lead wiring 130 via the plugs 134. As a result, the plurality of source electrodes are connected to each other. The source electrode connecting section 132 may be formed using the same material as the source electrode 112 or the source electrode 114.

The source electrode connecting section 132 may be formed above the source electrode 112, the source electrode 114, the drain electrode 116, the drain electrode 118, or the gate electrodes 122. In this way, the concentration of an electric field in each of the gate electrodes 122 can be decreased. Furthermore, the source electrode connecting section 132 with the reference voltage applied thereto can be used as a field plate.

The source electrode connecting section 132 may be formed above the ends of the electrodes in the width direction of the gate electrode 122. The source electrode connecting section 132 may be formed over both ends of the electrodes in the width direction of the gate electrode 122. The width direction of the gate electrode 122 may be substantially parallel to the channel width direction. The source electrode connecting section 132 may be formed above at least a pair of a source electrode and a drain electrode.

The width $W_S$ of the source electrode connecting section 132 is greater than the width $W_D$ of the drain electrode connecting section 142. The total area of the gate electrodes 122 covered by the source electrode connecting section 132 may be greater than the total area of the gate electrodes 122 covered by the drain electrode connecting section 142. The total area of the arranged electrode group 110 covered by the source electrode connecting section 132 may be greater than the total area of the arranged electrode group 110 covered by the drain electrode connecting section 142.

The plugs 134 electrically connect the source electrode connecting section 132 to the source electrode 112, the source electrode 114, and the source electrode lead wiring 130. The plugs 134 may penetrate through the insulating layer 222, the insulating layer 224, and the protective layer 226 to electrically connect the source electrode connecting section 132 to the source electrode 112, the source electrode 114, and the source electrode lead wiring 130. The plugs 134 may be formed using the same materials as the source electrode 112 or the source electrode 114.

The drain electrode lead wiring 140 may be at least a portion of the terminals of the HEMT 100 connected to the outside. The drain electrode lead wiring 140 may be an electrode pad or lead wiring connected to an electrode pad. Signal voltage of the HEMT 100 may be applied to the drain electrode lead wiring 140. The drain electrode lead wiring 140 is electrically connected to the drain electrode 116 and the drain electrode 118. The drain electrode lead wiring 140 may be formed using the same material as the drain electrode 116 or the drain electrode 118.

The arranged electrode group 110 and the drain electrode lead wiring 140 may be arranged in the channel length direction of the channel regions formed in the arranged electrode group 110. For example, the drain electrode lead wiring 140 may extend away from the arranged electrode group 110, from one end of arranged electrode group 110 in the arrangement direction C. At least a portion of the drain electrode lead wiring 140 may extend in a direction substantially parallel to the arrangement direction C. As a result, compared to arranging the arranged electrode group 110 and the drain electrode lead wiring 140 in the channel width direction of the channel regions, the above arrangement can achieve a lower leak current between the arranged electrode group 110 and the drain electrode lead wiring 140.

The drain electrode lead wiring 140 may be arranged adjacent to the drain electrode 116. In this way, the drain electrode lead wiring 140 can be arranged adjacent to the drain electrode, from among the plurality of drain electrodes, that is closest to the drain electrode lead wiring 140. As a result, compared to arranging the drain electrode lead wiring 140 adjacent to a source electrode included in the arranged electrode group 110, the above arrangement can achieve a lower leak current between the arranged electrode group 110 and the drain electrode lead wiring 140.

The drain electrode connecting section 142 is electrically connected to the drain electrode 116, the drain electrode 118, and the drain electrode lead wiring 140. The drain electrode connecting section 142 may be electrically connected to the drain electrode 116, the drain electrode 118, or the drain electrode lead wiring 140 via the plugs 144. As a result, the plurality of drain electrodes are connected to each other. The drain electrode connecting section 142 may be formed using the same material as the drain electrode 116 or the drain electrode 118.

The plugs 144 electrically connect the drain electrode connecting section 142 to the drain electrode 116, the drain electrode 118, and the drain electrode lead wiring 140. The plugs 144 may penetrate through the insulating layer 222, the insulating layer 224, and the protective layer 226 to electrically connect the drain electrode connecting section 142 to the drain electrode 116, the drain electrode 118, and the drain electrode lead wiring 140. The plugs 144 may be formed using the same materials as the drain electrode 116 or the drain electrode 118.

The non-element-isolation region 150 indicates a region on the substrate 102 without element isolation. At least a portion of each of the source electrode 112, the source electrode 114, the drain electrode 116, the drain electrode 118, and the gate electrode 122 is formed on the non-element-isolation region 150. A channel region of the HEMT 100 is formed on at least a portion of the non-element-isolation region 150. The non-element-isolation region 150 can be formed by protecting the region corresponding to the non-element-isolation region 150 with a mask when forming the element isolation region 240, for example.

The support substrate 212 supports the semiconductor thin film formed on the substrate 102. The support substrate 212 may be an example of material used to form the semiconductor substrate or an example of the semiconductor substrate. The support substrate 212 may be a SiC substrate, a sapphire substrate, or a Si substrate.

The channel layer 214 forms the channels of the HEMT 100. Two-dimensional electron gas is formed at the interface between the channel layer 214 and the spacer layer 215. The two-dimensional electron gas forms a current channel between the source electrodes and the drain electrodes. The channel layer 214 may be GaN. The channel layer 214 may be i-type GaN.

The spacer layer 215 is arranged between the channel layer 214 and the carrier supply layer 216. As a result, the two-dimensional electron gas can be formed at a position distanced from the carrier supply layer 216. The spacer layer 215 may be AlGaN. The spacer layer 215 may be i-type AlGaN.

The carrier supply layer 216 supplies carriers to the channel layer 214. The carrier supply layer may be AlGaN. The carrier supply layer 216 may be n-type AlGaN. The n-type impurity added to the AlGaN may be Si.

The cap layer 218 can adjust the stress on a layer formed between the cap layer 218 and the support substrate 212. The cap layer 218 may be made of the same material as the channel layer 214. The cap layer 218 may be n-type GaN. The n-type impurity added to the GaN may be Si.

The insulating layer 222 is arranged between the substrate 102 and the protective layer 226. In this way, the penetration of impurities acting as donors or acceptors into the semiconductor on the surface of the substrate 102 can be suppressed. As a result, the leak current of the HEMT 100 can be decreased. When the protective layer 226 is made using a material such as silicon nitride, nitride oxide silicon, or the like, for example, the leak current of the HEMT 100 can increase when the semiconductor on the surface of the substrate 102 is doped with the Si contained in the protective layer 226.

For example, in the present embodiment, the carrier supply layer 216 is formed on the surface of the substrate 102 between the source electrode 112 and the source electrode lead wiring 130, and also between the drain electrode 116 and the drain electrode lead wiring 140. If the carrier supply layer 216 is made using a compound semiconductor such as n-type AlGaN, the leak current between the source electrode 112 and the source electrode lead wiring 130 or between the drain electrode 116 and the drain electrode lead wiring 140 increases when the carrier supply layer 216 is doped with the Si contained in the protective layer 226.

Similarly, in the present embodiment, the cap layer 218 is arranged on the surface of the substrate 102 between each of the source electrodes and drain electrodes. If the cap layer 218 is made using a compound semiconductor such as n-type GaN, the leak current between the source electrodes and the drain electrodes increases when the cap layer 218 is doped with the Si contained in the protective layer 226.

The insulating layer 222 in the present embodiment is arranged between the substrate 102 and the and the protective layer 226, and so in this case, doping of the material contained in the protective layer 226 into the semiconductors arranged on the surface of the substrate 102 can be suppressed. As a result, even when the protective layer 226 contains impurities that can act as donors or acceptors with respect to the semiconductors arranged on the surface of the substrate 102, the leak current of the HEMT 100 can be decreased.

The insulating layer 222 may electrically isolate the substrate 102 from the protective layer 226. The insulating layer 222 may form a portion of the gate insulating film of the HEMT 100. The insulating layer 222 may include tantalum oxide, zirconium oxide, hafnium oxide, lanthanum oxide, titanium oxide, barium strontium oxide (BST), strontium titanium oxide (STO), lead zirconate titanate (PZT), or strontium bismuth tantalum oxide (SBT). The insulating layer 222 may be a layered structure including layers formed of the above materials. The insulating layer 222 may have a dielectric constant of 10 or more. The insulating layer 222 may have a thickness from 10 nm to 20 nm.

The present embodiment describes an example in which the insulating layer 222 is arranged over the entire cap layer 218 between the pairs of source electrodes and drain electrodes, but the insulating layer 222 is not limited to this arrangement. For example, part of insulating layer 222 may be removed, such that the insulating layer 222 only remains directly below the gate electrodes 122. Compared to arranging the insulating layer 222 over the entire cap layer 218, this arrangement can achieve a lower ON resistance in the HEMT 100.

The insulating layer 224 is arranged between (i) the gate electrode lead wiring 120, the gate electrode 122, the gate electrode connecting section 124 and (ii) the protective layer 226. The insulating layer 224 may be arranged between the electrodes forming the arranged electrode group 110 and the protective layer 226. As a result, the leak current between (i) the gate electrode lead wiring 120, the gate electrode 122, and the gate electrode connecting section 124 and (ii) the electrodes forming the arranged electrode group 110 can be decreased. The insulating layer 224 may be made using the same material as the insulating layer 222. The insulating layer 224 may have a thickness from 5 nm to 100 nm.

If the protective layer 226 is made of a material containing Si such as silicon nitride or nitride oxide silicon, for example, the metal contained in the electrodes forming the arranged electrode group 110, the gate electrode lead wiring 120, the gate electrode 122, or the gate electrode connecting section 124 can cause the protective layer 226 to become a silicide. In this case as well, the leak current described above can be decreased by adopting the above configuration.

The protective layer 226 protects the HEMT 100 from humidity, impurities, and the like. The protective layer 226 may have insulating properties. The protective layer 226 may include Si. The protective layer 226 may include Si and nitrogen. The protective layer 226 may include silicon nitride or nitride oxide silicon. The thickness of the protective layer 226 may be from 100 nm to 200 nm.

The protective layer 226 may be formed at a temperature of 260° C. or less, preferably 100° C. or less. In this way, the leak current of the HEMT 100 can be decreased. The protective layer 226 can be formed using CVD such as plasma CVD or remote plasma CVD, for example. Remote plasma CVD involves forming the film at a lower temperature than other types of CVD, and therefore the protective layer 226 is preferably formed using remote plasma CVD.

The element isolation region 240 electrically isolates the HEMT 100 from other electronic elements. The element isolation region 240 may be the portion of the substrate 102 other than the region in which the electrodes of the arranged electrode group 110 are formed and the region in which the channel regions of the HEMT 100 are formed. The element isolation region 240 may reach to the support substrate 212. The element isolation region 240 can be formed by implanting B ions, for example, in portions other than the non-element-isolation region 150 of the substrate 102. Here, Ar ions may be implanted instead of B ions. At least a portion of each of the gate electrode lead wiring 120, the gate electrode connecting section 124, the source electrode lead wiring 130, and the drain electrode lead wiring 140 may be formed on the element isolation region 240.

With the above configuration, the leak current of the semiconductor device can be decreased. Furthermore, the leak current can be decreased while suppressing the increase in the ON resistance of the semiconductor device. The HEMT 100 adopting the above configuration may have a leak current of 500 pA or less per 1 mm of gate width, and an ON resistance no greater than 2 Ωmm. This leak current value is preferably 250 pA/mm or less, more preferably 100 pA/mm or less, and most preferably 50 pA/mm or less. The leak current of the HEMT 100 here refers to the sum of the leak current between (i) the gate electrode lead wiring 120, the gate electrode 122, and the gate electrode connecting section 124 and (ii) the electrodes forming the arranged electrode group 110 and the leak current between each pair of electrodes forming the arranged electrode group 110.

The present embodiment describes the HEMT 100 as an example of a semiconductor device, but the semiconductor device is not limited to an HEMT (High Electron Mobility Transistor). For example, the semiconductor device may be a MISFET (Metal-Insulator-Semiconductor Field Effect Transistor) in which a plurality of source regions and drain regions are arranged in an alternating manner. In this case, the source regions and drain regions of the MISFET may respectively be examples of ground side electrodes and signal side electrodes. A silicide or semiconductor with high impurity concentration may be used as the gate electrode. The MISFET may be a MOSFET (Metal-Oxide-Semiconductor Field Effect Transistor).

Figure 4:
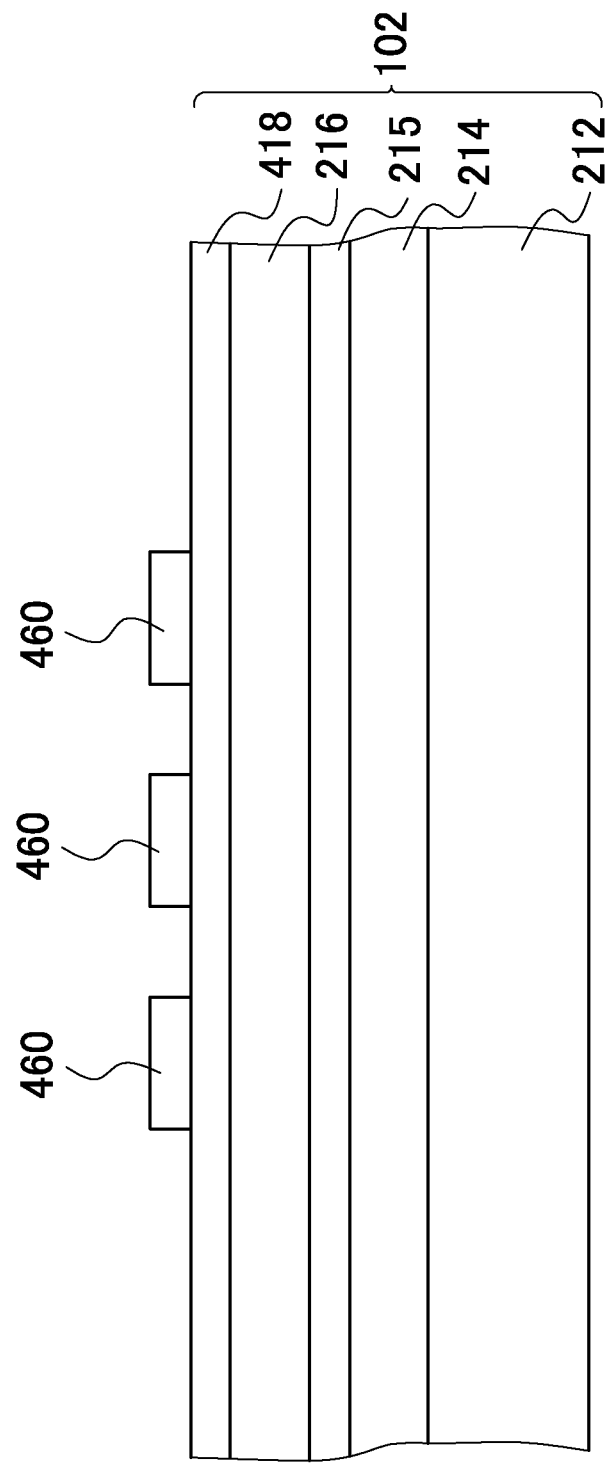
FIG. 4 schematically shows an exemplary cross sectional-view in a process for manufacturing the HEMT 100.

The following describes an exemplary manufacturing method of the HEMT 100, using FIGS. 4 to 13. FIGS. 4 to 13 show cross sections corresponding to cross sections over the line B-B' of FIG. 1. FIG. 4 schematically shows an exemplary cross sectional-view in a process for manufacturing the HEMT 100. As shown in FIG. 4, in the present embodiment, the substrate 102 is prepared first. At this stage, the substrate 102 includes the support substrate 212, the channel layer 214, the spacer layer 215, the carrier supply layer 216, and the cap layer 218 in the stated order. The substrate 102 may include a buffer layer between the support substrate 212 and the channel layer 214. The buffer layer reduces the effect of crystallinity of the surface of the support substrate 212 or impurities in the surface of the support substrate 212 on the crystallinity or electric characteristics of the channel layer 214. Next, a photoresist is applied on the prepared substrate 102, and then a mask 460 is formed by patterning the photoresist.

The mask 460 is patterned such that at least a portion of the cap layer 418 in the region where the arranged electrode group 110 is to be formed is removed in the following step. The mask 460 may be patterned such that the cap layer 418 in the element isolation region 240 remains. The mask 460 may be patterned such that the cap layer 418 between the source electrode 112 and the source electrode lead wiring 130 and between the drain electrode 116 and the drain electrode lead wiring 140 in the element isolation region 240 is removed in the following step.

Figure 5:
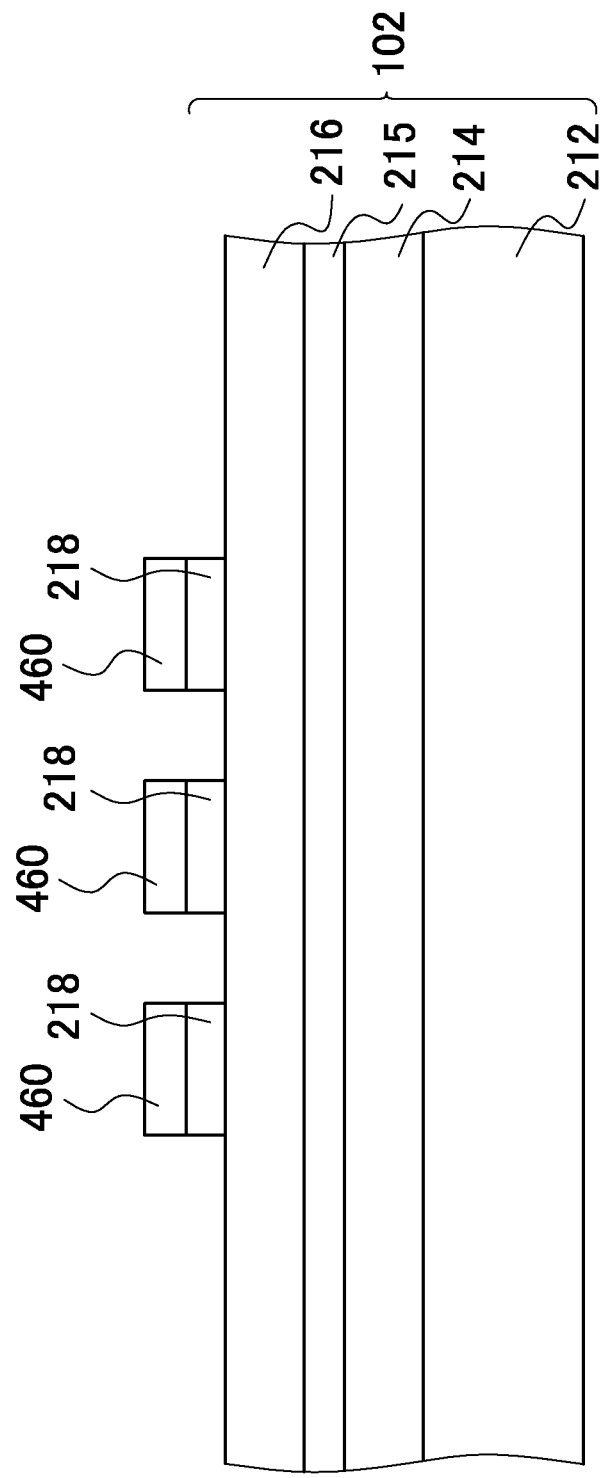
FIG. 5 schematically shows an exemplary cross sectional-view in a process for manufacturing the HEMT 100.

FIG. 5 schematically shows an exemplary cross sectional-view in a process for manufacturing the HEMT 100. As shown in FIG. 5, the mask 460 is used to pattern the cap layer 418, using dry etching or the like. As a result, the cap layer 218 is formed.

Figure 6:
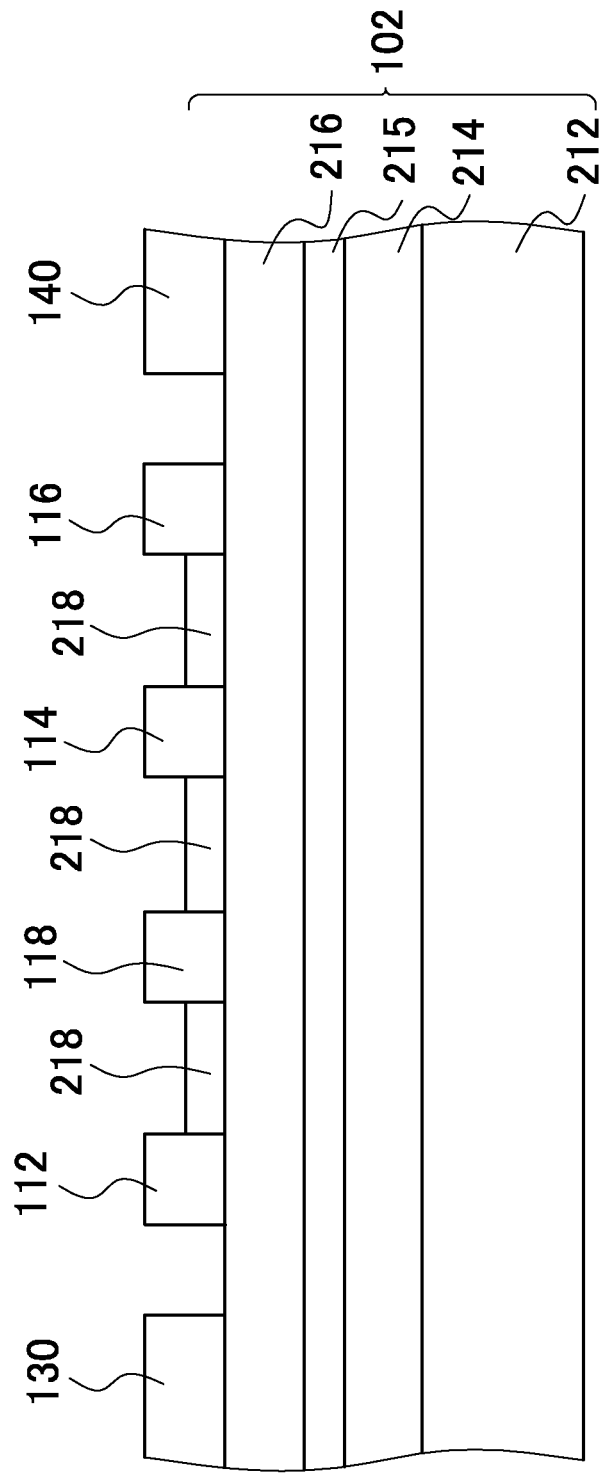
FIG. 6 schematically shows an exemplary cross sectional-view in a process for manufacturing the HEMT 100.

FIG. 6 schematically shows an exemplary cross sectional-view in a process for manufacturing the HEMT 100. As shown in FIG. 6, the source electrode 112, the source electrode 114, the source electrode lead wiring 130, the drain electrode 116, the drain electrode 118, and the drain electrode lead wiring 140 are formed on the substrate 102 on which the cap layer 218 is formed. These components can be formed using sputtering or deposition such as vacuum deposition. Next, the mask 460 is removed. The substrate 102 on which the above components are formed may be annealed. The annealing may be performed in a nitrogen atmosphere.

Figure 7:
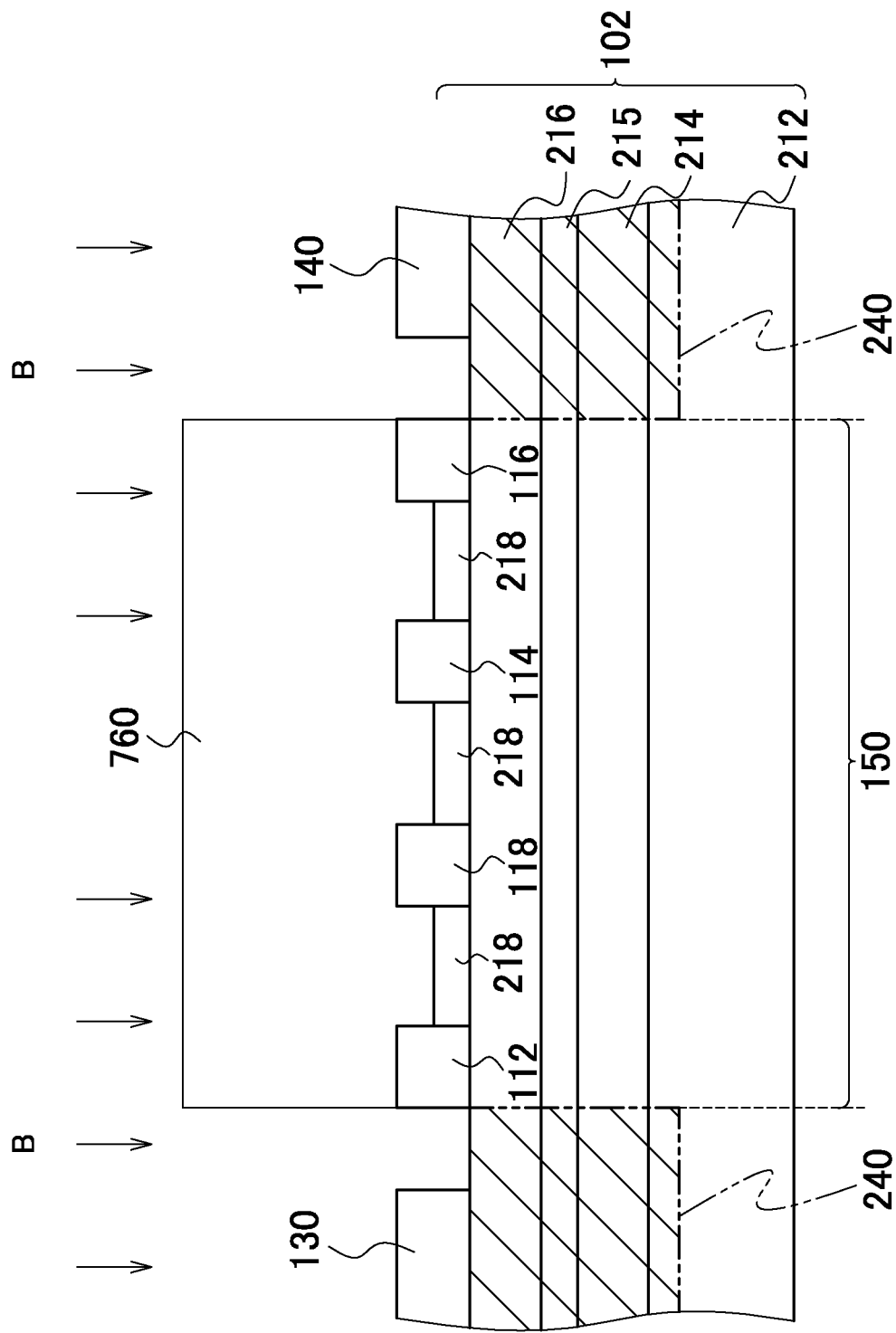
FIG. 7 schematically shows an exemplary cross sectional-view in a process for manufacturing the HEMT 100.

FIG. 7 schematically shows an exemplary cross sectional-view in a process for manufacturing the HEMT 100. As shown in FIG. 7, the element isolation region 240 is formed in the substrate 102. The element isolation region 240 can be formed by forming a mask 760 covering the non-element-isolation region 150 of the substrate 102 and then implanting B ions in the substrate 102, for example. Here, Ar ions may be implanted instead of B ions.

Figure 8:
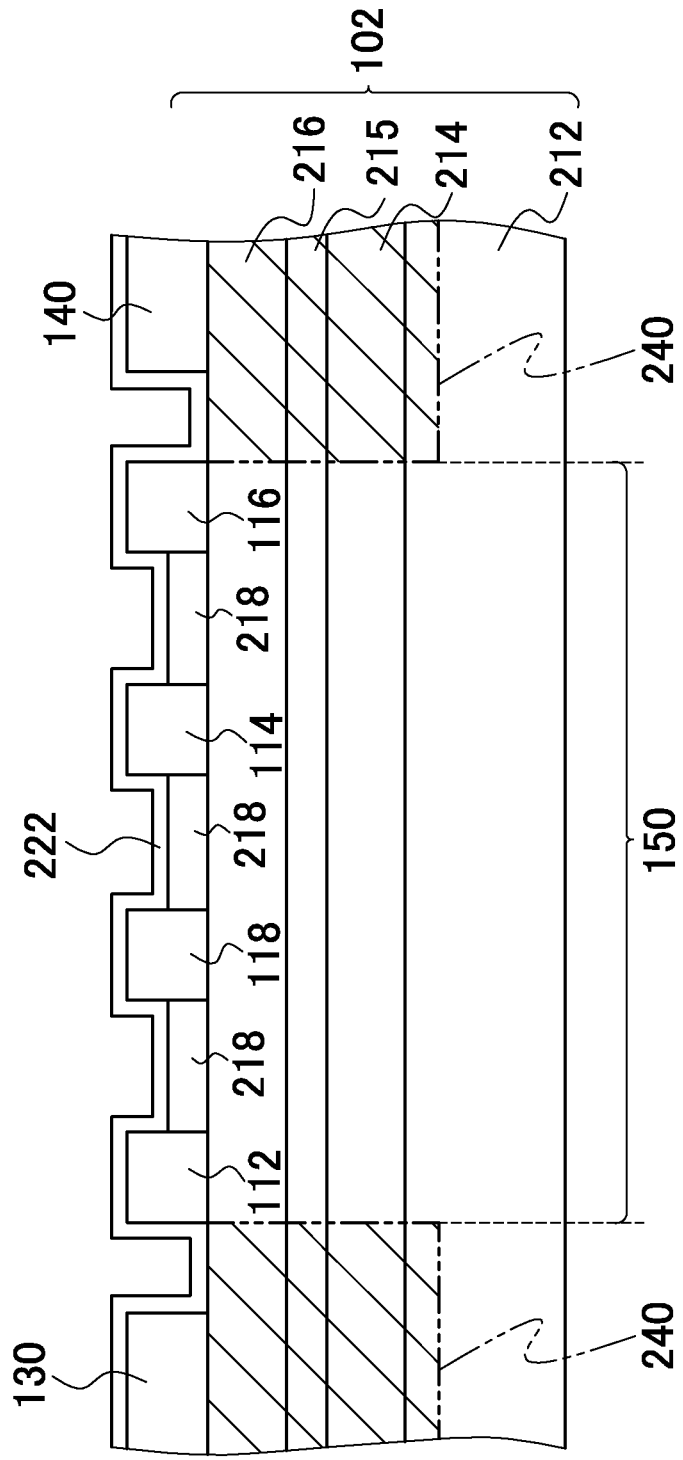
FIG. 8 schematically shows an exemplary cross sectional-view in a process for manufacturing the HEMT 100.

FIG. 8 schematically shows an exemplary cross sectional-view in a process for manufacturing the HEMT 100. As shown in FIG. 8, the insulating layer 222 is formed on the surface of the substrate 102. The insulating layer 222 may be formed over the entire substrate 102. In this way, the source electrode 112, the source electrode 114, the source electrode lead wiring 130, the drain electrode 116, the drain electrode 118, the drain electrode lead wiring 140, the carrier supply layer 216, and the cap layer 218 on the surface of the substrate 102 are covered by the insulating layer 222. The insulating layer 222 can be formed by coating, CVD, sputtering, or deposition such as vacuum deposition, for example.

Figure 9:
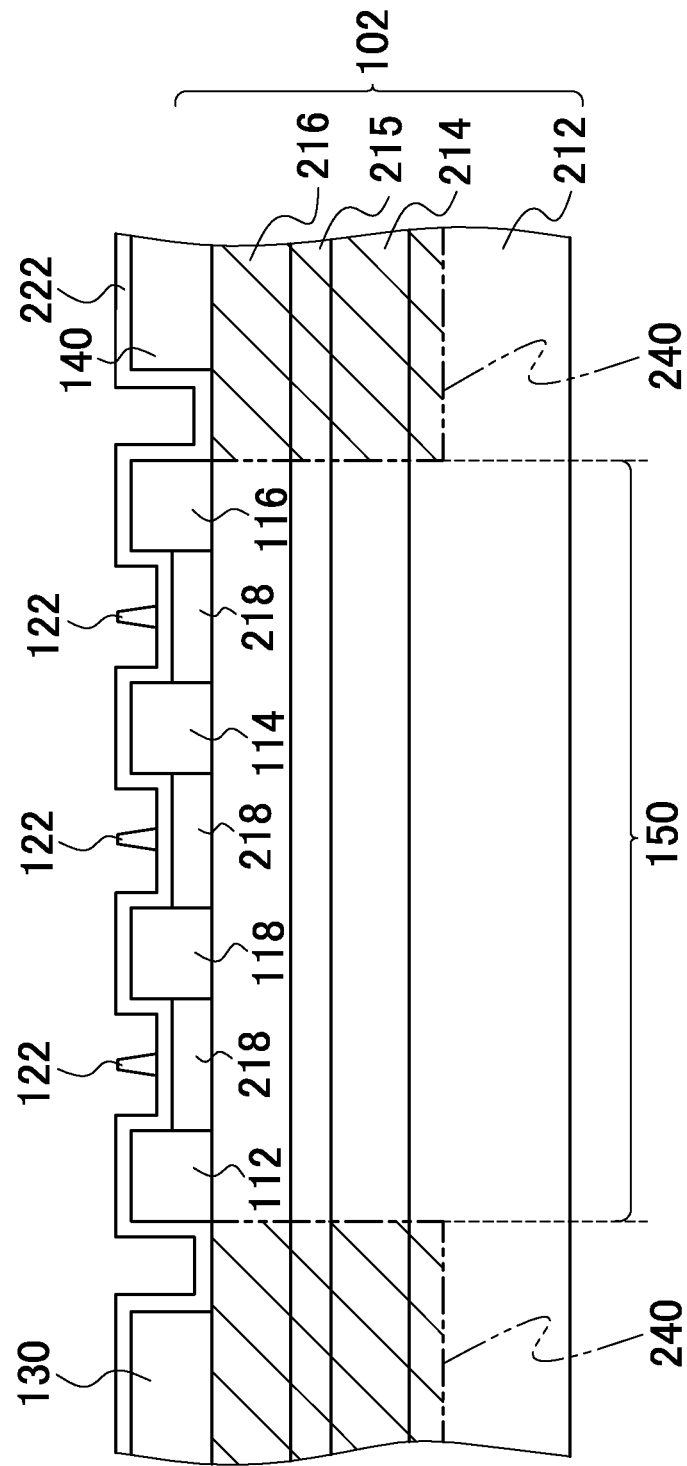
FIG. 9 schematically shows an exemplary cross sectional-view in a process for manufacturing the HEMT 100.

FIG. 9 schematically shows an exemplary cross sectional-view in a process for manufacturing the HEMT 100. As shown in FIG. 9, gate electrodes 122 are formed respectively between the source electrode 112 and the drain electrode 118, between the drain electrode 118 and the source electrode 114, and between the source electrode 114 and the drain electrode 116. The gate electrodes 122 can be formed using sputtering or deposition such as vacuum deposition, for example.

If the portion of the insulating layer 222 that is not directly under the gate electrodes 122 is to be removed, the insulating layer 222 may be removed at this stage. For example, the insulating layer 222 may be removed by dry etching or the like with a chloride gas such as chlorine gas. If the insulating layer 222 is removed by dry etching, the annealing is preferably performed after the insulating layer 222 is removed. As a result, the ON resistance can be decreased.

The annealing may be performed in a nitrogen atmosphere. The annealing is preferably performed at a temperature no greater than 360° C. The annealing is more preferably performed at a temperature no greater than 260° C. As a result, the restoration of the crystalline structure of the element isolation region 240 can be prevented and the leak current can be further decreased.

Figure 10:
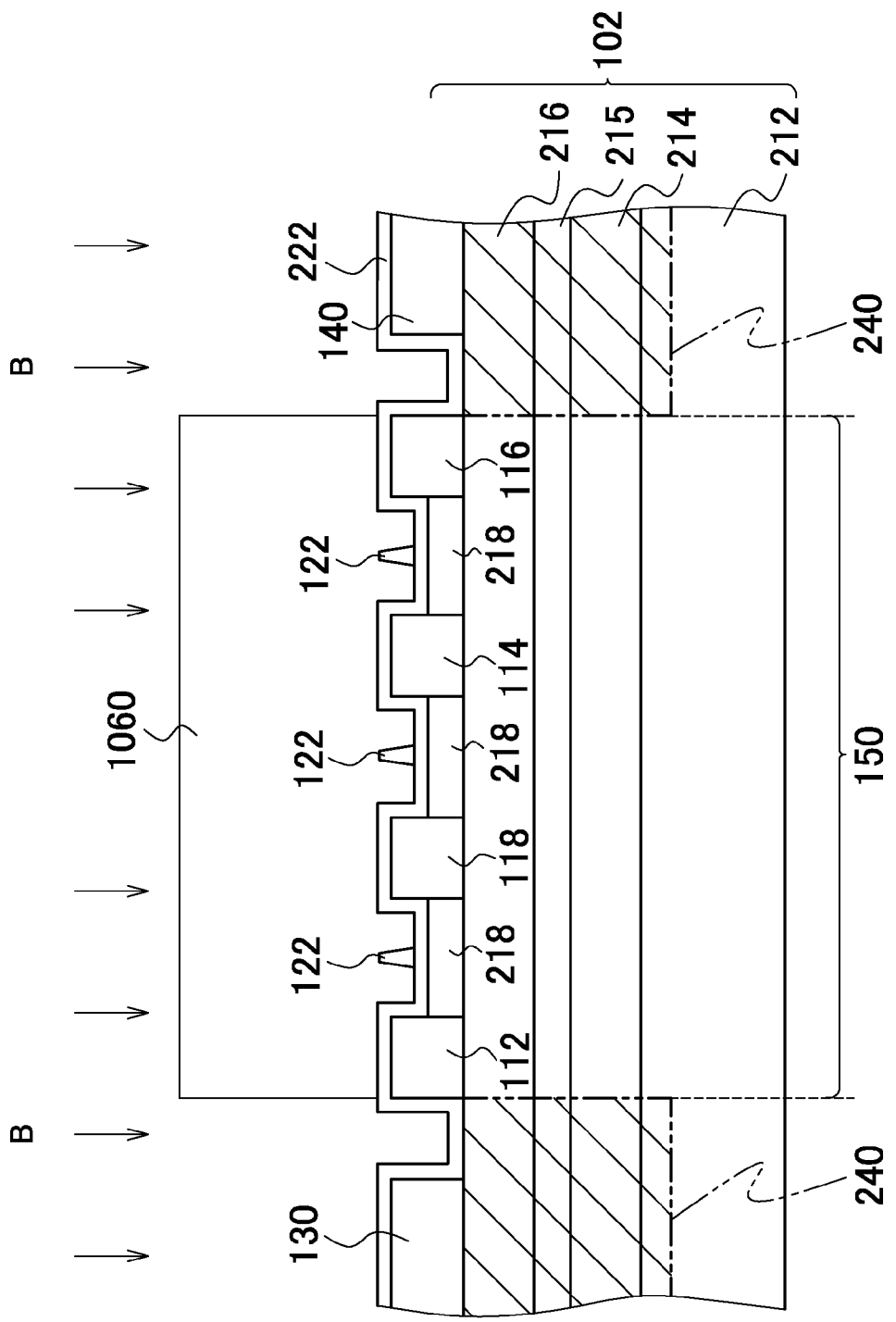
FIG. 10 schematically shows an exemplary cross sectional-view in a process for manufacturing the HEMT 100.

FIG. 10 schematically shows an exemplary cross sectional-view in a process for manufacturing the HEMT 100. As shown in FIG. 10, the element isolation process of the element isolation region 240 may be performed again. As a result, the leak current can be further decreased. The element isolation process of the element isolation region 240 can be performed by forming a mask 1060 covering the non-element-isolation region 150 of the substrate 102, and then implanting B ions in the substrate 102.

As described in relation to FIG. 9, performing the annealing in a nitrogen atmosphere after the gate electrodes 122 are formed can increase the leak current in the element isolation region 240. The increase in the leak current in the element isolation region 240 can be suppressed by forming the gate electrodes 122, performing the annealing, and then once again performing the element isolation process. As a result, even when the annealing is performed at a temperature above 260° C., the occurrence of leak current in the element isolation region 240 can be suppressed. The steps performed after the second element isolation process are preferably performed at a temperature of 260° C. or less.

Figure 11:
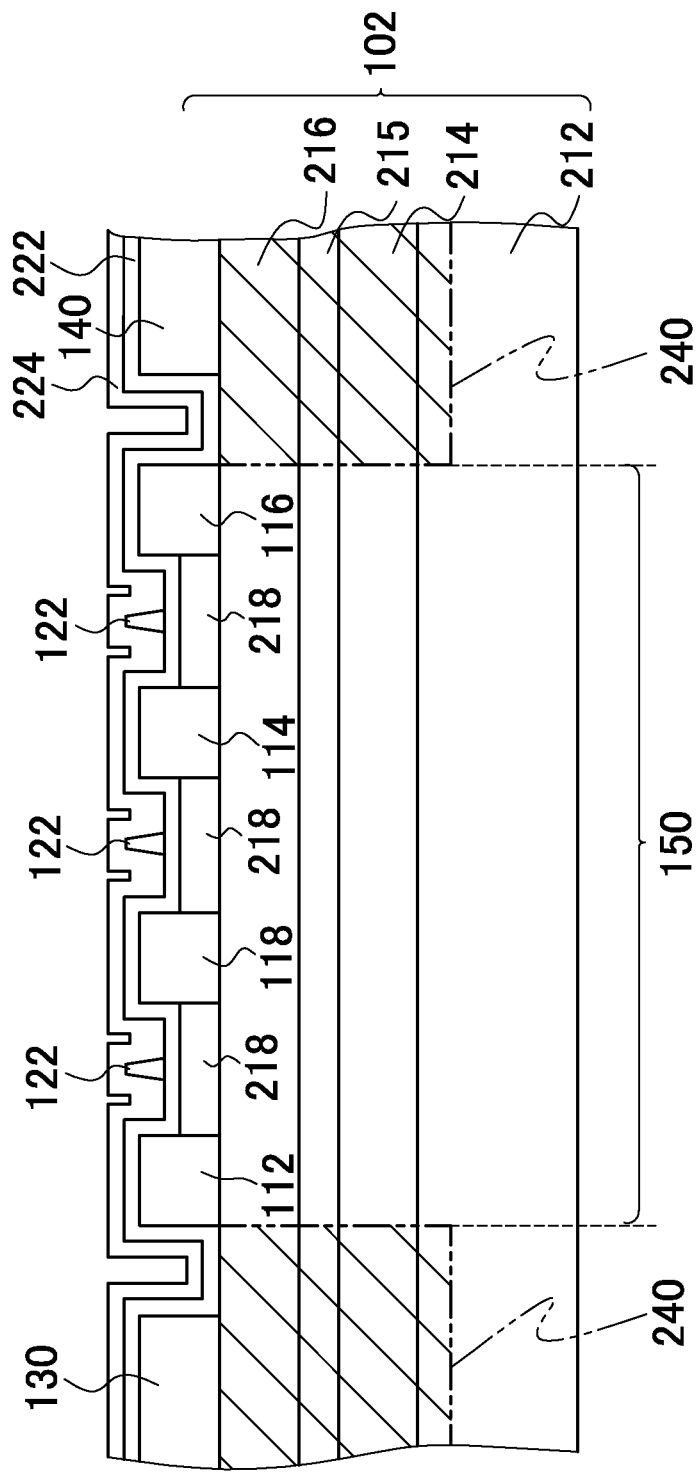
FIG. 11 schematically shows an exemplary cross sectional-view in a process for manufacturing the HEMT 100.

FIG. 11 schematically shows an exemplary cross sectional-view in a process for manufacturing the HEMT 100. As shown in FIG. 11, the insulating layer 224 is formed on the surface of the substrate 102. The insulating layer 224 may be formed over the entire substrate 102. As a result, the gate electrode 122 is covered by the insulating layer 224. If the portion of the insulating layer 222 that is not directly below the gate electrodes 122 is removed, the insulating layer 224 covers not only the gate electrodes 122 but also the source electrode 112, the source electrode 114, the source electrode lead wiring 130, the drain electrode 116, the drain electrode 118, the drain electrode lead wiring 140, the carrier supply layer 216, and the cap layer 218 formed on the surface of the substrate 102. The insulating layer 224 can be formed by coating, CVD, sputtering, or deposition such as vacuum deposition, for example.

Figure 12:
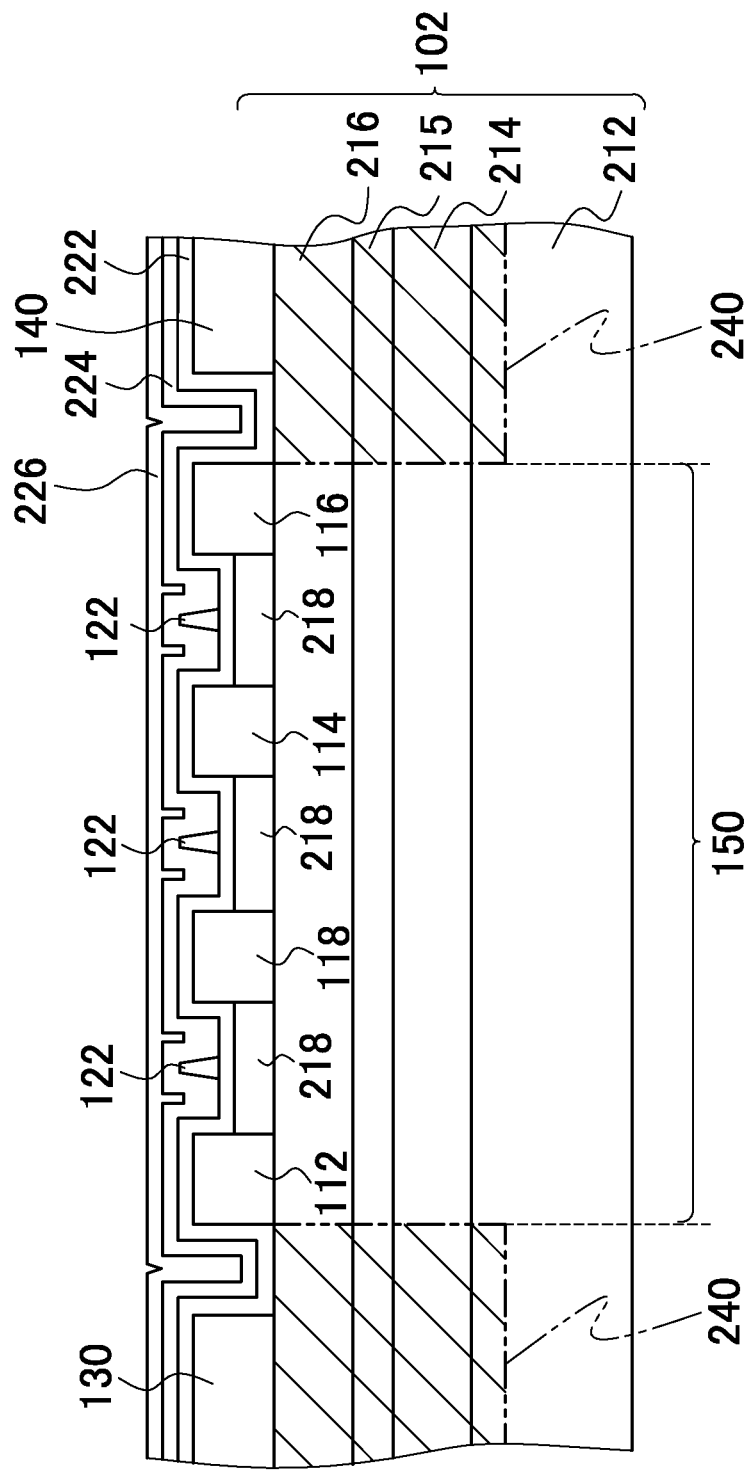
FIG. 12 schematically shows an exemplary cross sectional-view in a process for manufacturing the HEMT 100.

FIG. 12 schematically shows an exemplary cross sectional-view in a process for manufacturing the HEMT 100. As shown in FIG. 12, the protective layer 226 is formed on the surface of the substrate 102. The protective layer 226 may be formed over the entire substrate 102. The protective layer 226 is preferably formed at a temperature of 260° C. or less, more preferably 100° C. or less. In this way, increase of the leak current in the element isolation region 240 can be suppressed. Furthermore, if the protective layer 226 includes Si, the formation of silicide in the protective layer 226 can be suppressed. On the other hand, the protective layer 226 may be formed at a temperature greater than or equal to room temperature. The protective layer 226 can be formed by coating CVD, sputtering, or deposition such as vacuum deposition, for example. The protective layer 226 may be formed by remote plasma CVD. The protective layer 226 may be formed at a temperature no less than room temperature and no greater than 260° C., using remote plasma CVD.

Figure 13:
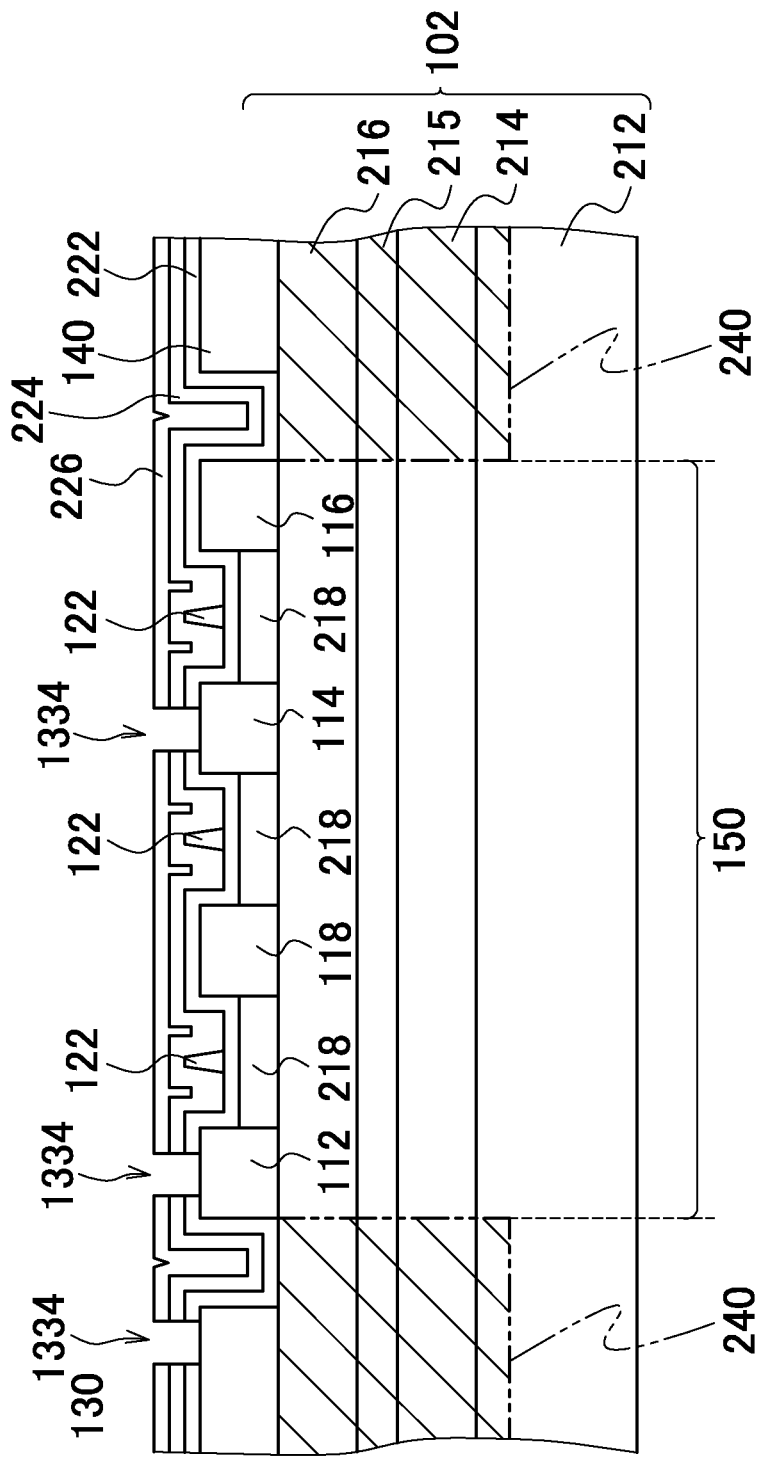
FIG. 13 schematically shows an exemplary cross sectional-view in a process for manufacturing the HEMT 100.

FIG. 13 schematically shows an exemplary cross sectional-view in a process for manufacturing the HEMT 100. As shown in FIG. 13, a plurality of openings 1334 are formed in the insulating layer 222, the insulating layer 224, and the protective layer 226. The openings 1334 may be formed at the positions where the plugs 134 and the plugs 144 are to be formed. The openings 1334 may expose portions of the source electrode 112, the source electrode 114, the source electrode lead wiring 130, the drain electrode 116, the drain electrode 118, and the drain electrode lead wiring 140. The openings 1334 can be formed by etching or ion milling, for example.

Next, a plug 134 or a plug 144 is formed in each opening 1334, and then the source electrode connecting section 132 and the drain electrode connecting section 142 are formed on the protective layer 226, for example. The plugs 134 and the plugs 144 can be formed by plating, CVD, sputtering, or deposition such as vacuum deposition, for example. The source electrode connecting section 132 and the drain electrode connecting section 142 can be formed by forming a metal thin film using plating, CVD, sputtering, or deposition such as vacuum deposition and then patterning the metal thin film, for example. As a result of the above, the HEMT 100 can be manufactured.

An insulating layer and a protective layer may further be formed on the source electrode connecting section 132 and the drain electrode connecting section 142. The present embodiment describes an example in which the source electrode connecting section 132 and the drain electrode connecting section 142 are formed by patterning a metal thin film formed on the protective layer 226, but the source electrode connecting section 132 and the drain electrode connecting section 142 are not limited to this. For example, the source electrode connecting section 132 and the drain electrode connecting section 142 may have a point-to-point construction.

Figure 14:
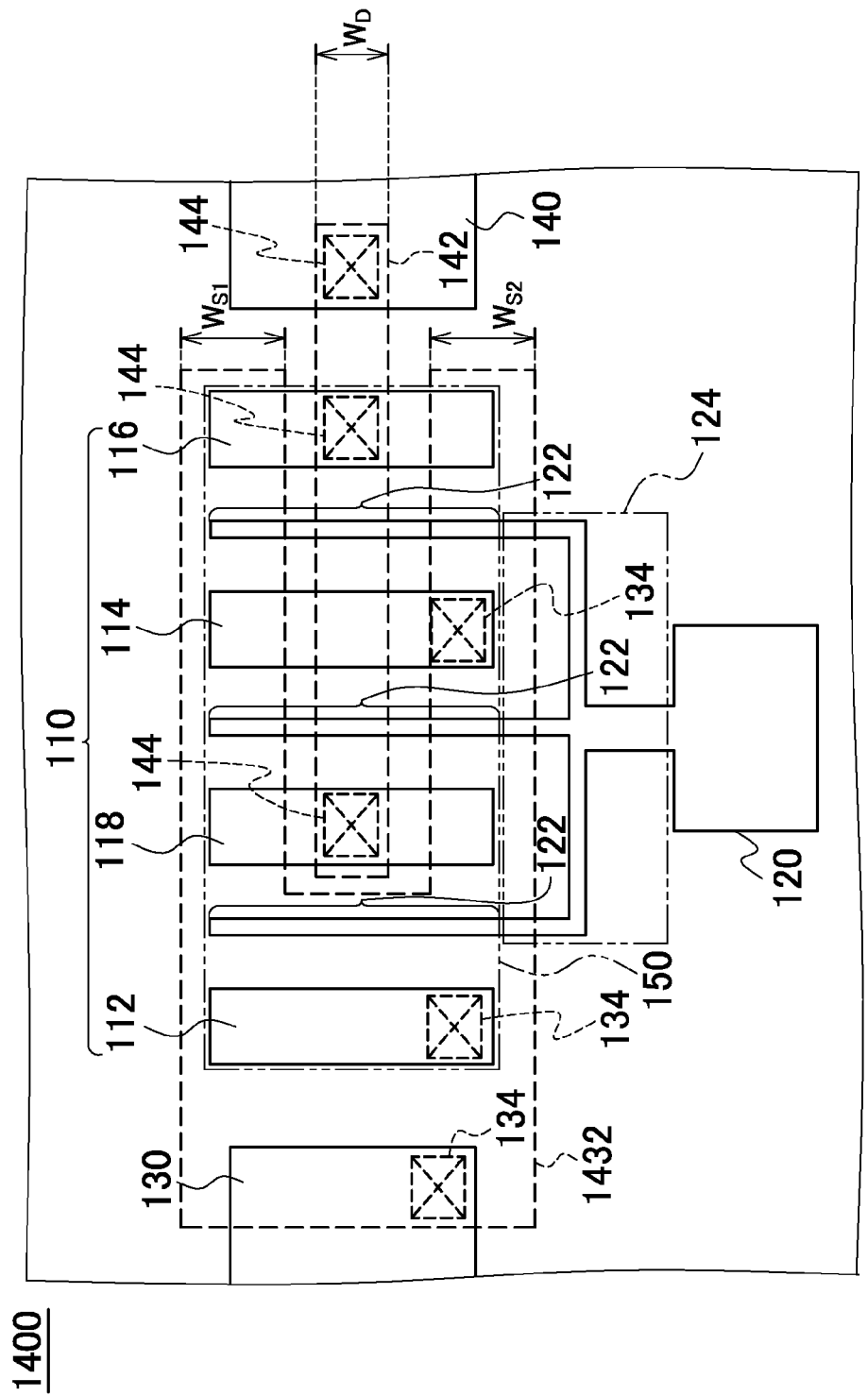
FIG. 14 schematically shows an exemplary planar view of another HEMT 1400.

FIG. 14 schematically shows an exemplary planar view of a HEMT 1400 according to another embodiment. The HEMT 1400 differs from the HEMT 100 in that the shape of the component corresponding to the source electrode connecting section 132 is different and the positional relationship between this component and the drain electrode connecting section 142 is different. Aside from these differences, the HEMT 1400 and the HEMT 100 may have the same configuration. The following explanation includes only differing points.

The source electrode connecting section 1432 corresponds to the source electrode connecting section 132 of the HEMT 100. The source electrode connecting section 1432 differs from the source electrode connecting section 132 in that it has a planar shape that is a sideways rectangular U. In the present embodiment, a portion of the source electrode connecting section 1432 is formed above both ends, in the direction of the width of the gate electrodes 122, of each electrode forming the arranged electrode group 110. Furthermore, the drain electrode connecting section 142 is formed over the regions near the centers, in the direction of the width of the gate electrodes 122, of the electrodes forming the arranged electrode group 110.

In the present embodiment, the sum of the width $W_{S1}$ and the width $W_{S2}$ of the source electrode connecting section 1432 is greater than the width $W_D$ of the drain electrode connecting section 142. The total area of the gate electrodes 122 covered by the source electrode connecting section 1432 is greater than the total area of the gate electrodes 122 covered by the drain electrode connecting section 142. The total area of the arranged electrode group 110 covered by the source electrode connecting section 1432 is greater than the total area of the arranged electrode group 110 covered by the drain electrode connecting section 142.

Figure 15:
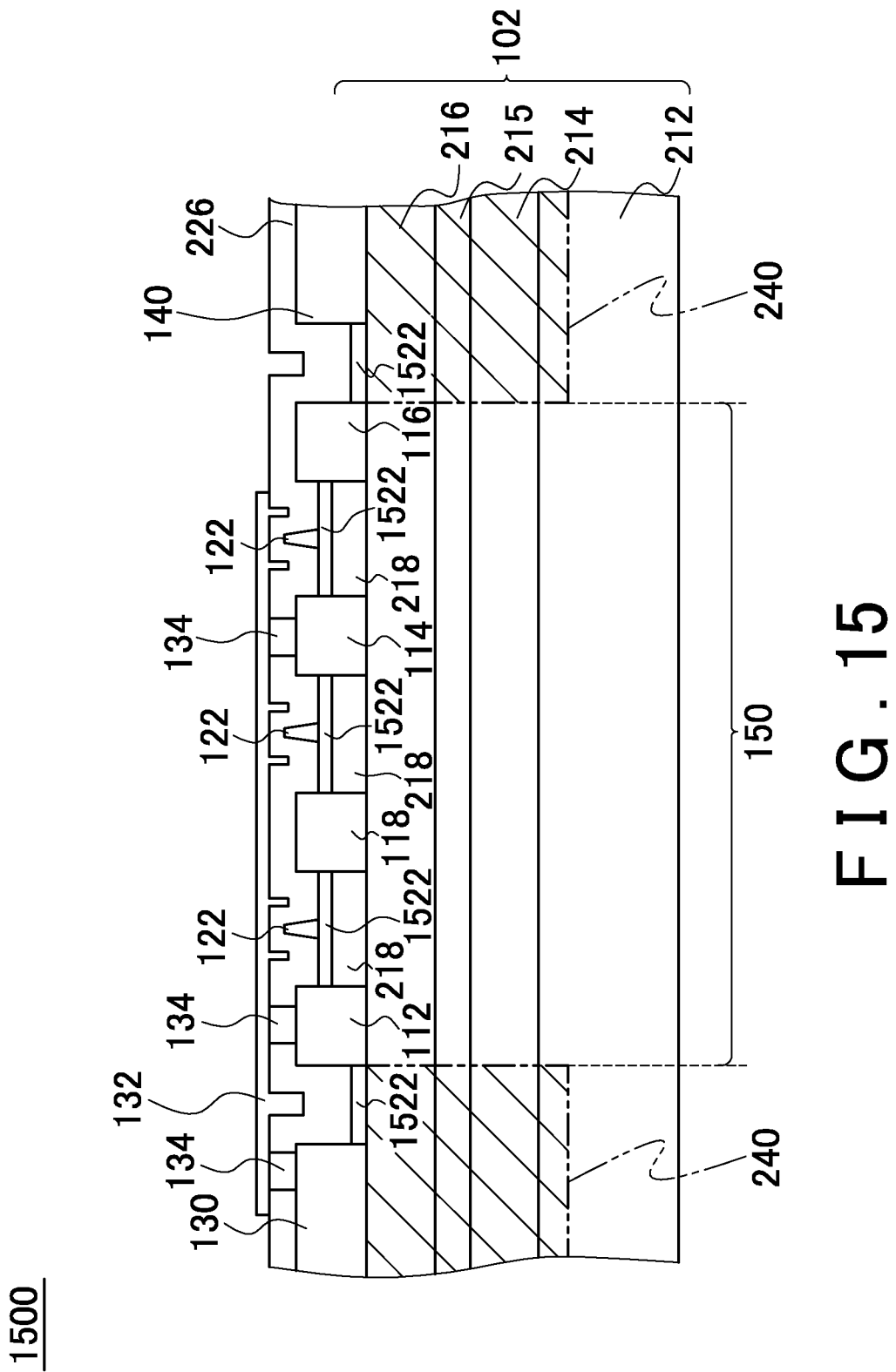
FIG. 15 schematically shows an exemplary cross-sectional view of another HEMT 1500.

FIG. 15 schematically shows an exemplary cross-sectional view of a HEMT 1500 according to another embodiment. The HEMT 1500 differs from the HEMT 100 in that the shape of the component corresponding to the insulating layer 222 is different and the protective layer 226 is formed at a temperature no greater than 260° C., preferably no greater than 100° C. Aside from these differences, the HEMT 1500 and the HEMT 100 may have the same configuration. The following explanation includes only differing points.

The insulating layer 1522 corresponds to the insulating layer 222 of the HEMT 100. The HEMT 1500 differs from the HEMT 100 in that the insulating layer 1522 is not formed over the electrodes forming the arranged electrode group 110, the source electrode lead wiring 130, or the drain electrode lead wiring 140. Furthermore the HEMT 1500 does not include a component corresponding to the insulating layer 224, and therefore the protective layer 226 contacts the electrodes forming the arranged electrode group 110, the gate electrode lead wiring 120, the gate electrode 122, the gate electrode connecting section 124, the source electrode lead wiring 130, and the drain electrode lead wiring 140. In this case, the leak current can be decreased if the protective layer 226 is formed at a temperature no greater than 260° C., preferably no greater than 100° C.

Figure 16:
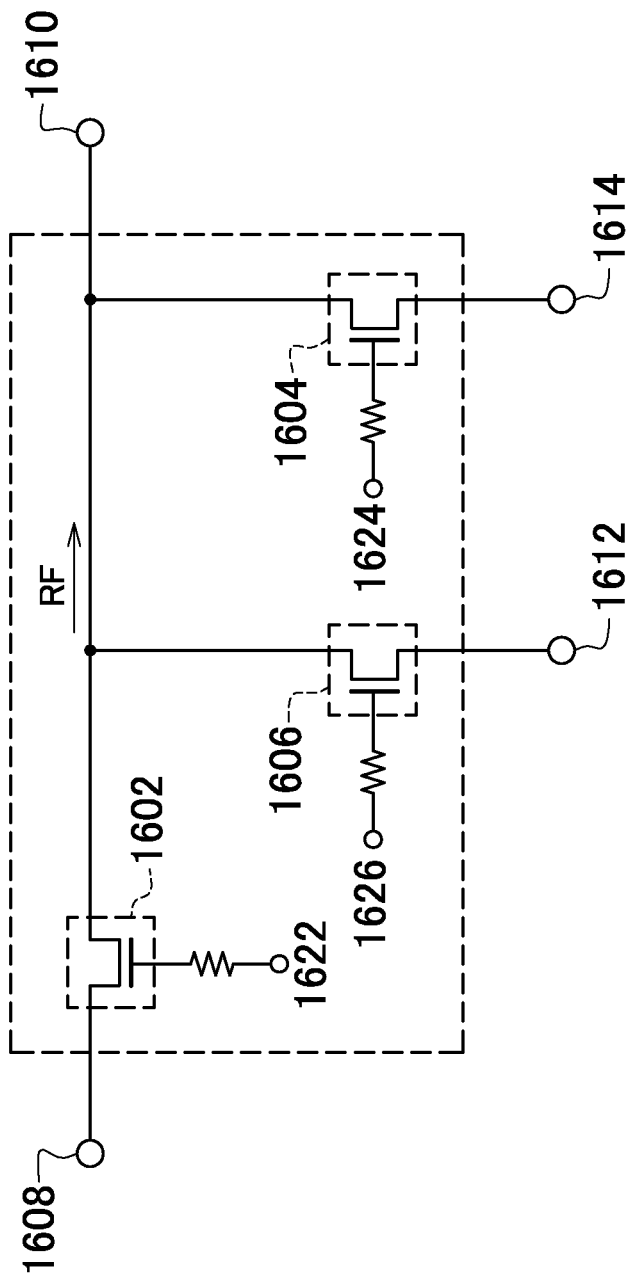
FIG. 16 schematically shows an exemplary configuration of a switching circuit 1600.

FIG. 16 schematically shows an exemplary configuration of a switching circuit 1600. The switching circuit 1600 may be a DC/RF switch. The switching circuit 1600 includes a transistor 1602, a transistor 1604, a transistor 1606, an input terminal 1608, an output terminal 1610, a DC terminal 1612, a DC terminal 1614, a control terminal 1622, a control terminal 1624, and a control terminal 1626.

The switching circuit 1600 switches which of the input signals from the input terminal 1608, the DC terminal 1612, and the DC terminal 1614 is output from the output terminal 1610. The switching circuit 1600 receives a high frequency signal (referred to as an "RF signal") from the input terminal 1608, and receives DC signals from the DC terminal 1612 and the DC terminal 1614.

The transistor 1602, the transistor 1604, and the transistor 1606 are switched ON and OFF according to control signals respectively received from the control terminal 1622, the control terminal 1624, and the control terminal 1626. As a result, the switching circuit can output one signal from among the input signals received from the input terminal 1608, the DC terminal 1612, and the DC terminal 1614.

The transistor 1602, the transistor 1604, and the transistor 1606 may each be the HEMT 100, the HEMT 1400, or the HEMT 1500. Therefore, the resulting switching circuit has low insertion loss even in a high-frequency band.

EMBODIMENTS

First Embodiment

The HEMT 100 shown in FIGS. 1 to 3 was manufactured according to the steps described in relation to FIGS. 4 to 13. The substrate 102 was prepared in the following way. A commercial SiC substrate was prepared as the support substrate 212. Metal organic chemical vapor deposition (MOCVD) was used to form i-type GaN as the channel layer 214 on the SiC substrate. MOCVD was used to form i-type AlGaN as the spacer layer 215 on the channel layer 214.

MOCVD was used to form n-type AlGaN as the carrier supply layer 216 on the spacer layer 215. MOCVD was used to form n-type GaN as the cap layer 418 on the carrier supply layer 216, thereby creating the substrate 102. The cap layer 418 was patterned using etching to form the cap layer 218.

Next, a Ti thin film, an Al thin film, a Ni thin film, and a Au thin film were layered in the stated order on the prepared substrate 102 as each of the source electrode 112, the source electrode 114, the drain electrode 116, and the drain electrode 118. A layered structure of a Au thin film formed on a Ti thin film was formed as each of the source electrode lead wiring 130 and the drain electrode lead wiring 140. Each source electrode and drain electrode was formed with a length of 15 μm in the channel length direction and a length of 100 μm in the channel width direction, and the source and drain electrodes were separated from each other by intervals of 3 μm. The distance between the source electrode lead wiring 130 and the arranged electrode group 110 and the distance between the drain electrode lead wiring 140 and the arranged electrode group 110 were each 5 μm.

After forming the layered structures, the substrate 102 was annealed in an $N_2$ atmosphere. The annealing was performed for 3 minutes at 750° C. Next, the element isolation process was performed on the element isolation region 240 of the substrate 102. The element isolation process involved forming the mask 760 on the arranged electrode group 110 and the channel regions of the HEMT 100, and then implanting B ions. Next, tantalum oxide was formed as the insulating layer 222, using vacuum deposition. The insulating layer 222 was formed over the entire surface of the substrate 102. The insulating layer 222 had a thickness of 20 nm.

After forming the insulating layer 222, the gate electrode lead wiring 120, the gate electrodes 122, and the gate electrode connecting section 124 were formed. These components were formed by forming a photoresist on the surface of the substrate 102, patterning the photoresist, and then forming a Ni thin film using vacuum deposition. The thickness of the Ni thin film was 100 nm. Each gate electrode had a gate length of 1 μm and a gate width of 100 μm, and was arranged in the center between a pair of a source electrode and a drain electrode. After removing the photoresist, the substrate was annealed in a nitrogen atmosphere. The annealing was performed for 60 minutes at a temperature of 360° C. After the annealing the element isolation process was again performed on the element isolation region 240.

Next, tantalum oxide was formed as the insulating layer 224 using vacuum deposition. The insulating layer 224 was formed over the entire surface of the substrate 102. The thickness of the insulating layer 224 was 5 nm. Silicon Nitride was formed as the protective layer 226 on the insulating layer 224, using remote CVD. When depositing the silicon nitride, the temperature of the substrate 102 was set to 100° C. The thickness of the protective layer 226 was 200 nm.

Next, the source electrode connecting section 132 and the drain electrode connecting section 142 were formed. Unlike the HEMT 100 shown in FIGS. 1 to 3, the source electrode connecting section 132 and the drain electrode connecting section 142 used a point-to-point construction. The width $W_S$ of the source electrode connecting section 132 and the width $W_D$ of the drain electrode connecting section 142 were each 35 μm.

Second Embodiment

The HEMT 1500 was manufactured in nearly the same manner as in the first embodiment. However, the second embodiment differs from the first embodiment in that, after forming the insulating layer 222, a portion of the insulating layer 222 was removed by etching. Furthermore, in the second embodiment, the step of forming the insulating layer 224 was omitted. In the same manner as the first embodiment, the second embodiment differs from the HEMT 100 shown in FIG. 15 by using a point-to-point construction for the source electrode connecting section 132 and the drain electrode connecting section 142.

Third Embodiment

The HEMT 1500 was manufactured in nearly the same manner as in the second embodiment. However, the third embodiment differs from the second embodiment in that CVD was used to form silicon nitride as the protective layer 226. In the third embodiment, when forming the silicon nitride, the temperature of the substrate 102 was set to 350° C.

Figure 17:
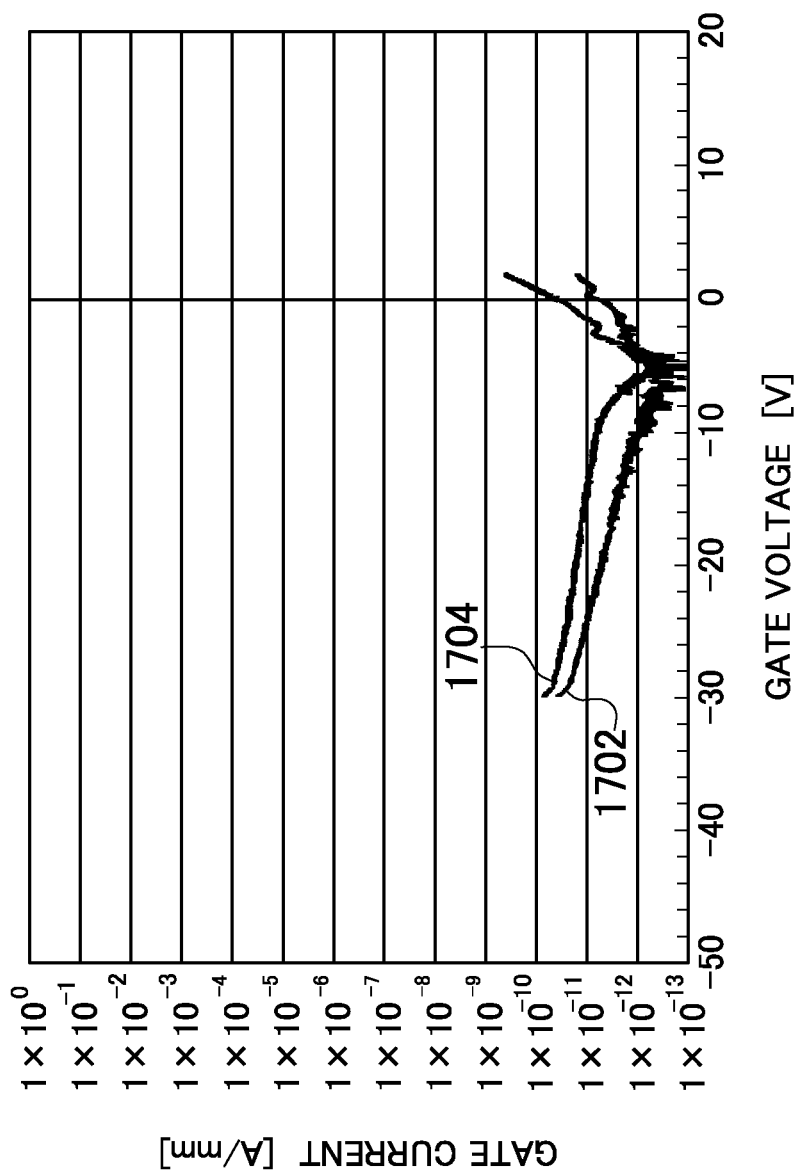
FIG. 17 shows leak current characteristics of a first embodiment and a second embodiment.

FIG. 17 shows gate current characteristics of the HEMTs of the first and second embodiments. In FIG. 17, the vertical axis represents the gate current per 1 mm of gate width [A/mm], and the horizontal axis represents the gate voltage [V]. In FIG. 17, the reference numeral 1702 indicates experimental results of the first embodiment and the reference numeral 1704 indicates experimental results of the second embodiment.

As shown in FIG. 17, the HEMTs of the first and second embodiments both have gate currents held below 500 pA/mm in a gate voltage range from −30 V to 0 V. Furthermore, the gate currents are held below 250 pA/mm in a gate voltage range from −25 V to 0 V, and held below 50 pA/mm in a gate voltage range from −20 V to 0 V. Based on these results, it is understood that adopting the configuration described above results in a semiconductor device with a decreased leak current.

In the range described above, the ON resistances of the HEMTs of the first and second embodiments are no greater than 2 Ωmm. Furthermore, the leak current between each pair of a source electrode and a drain electrode is small enough, relative to the gate current, to be ignored. Therefore, the gate current values can be thought of as being the same as the leak currents of the HEMTs.

Figure 18:
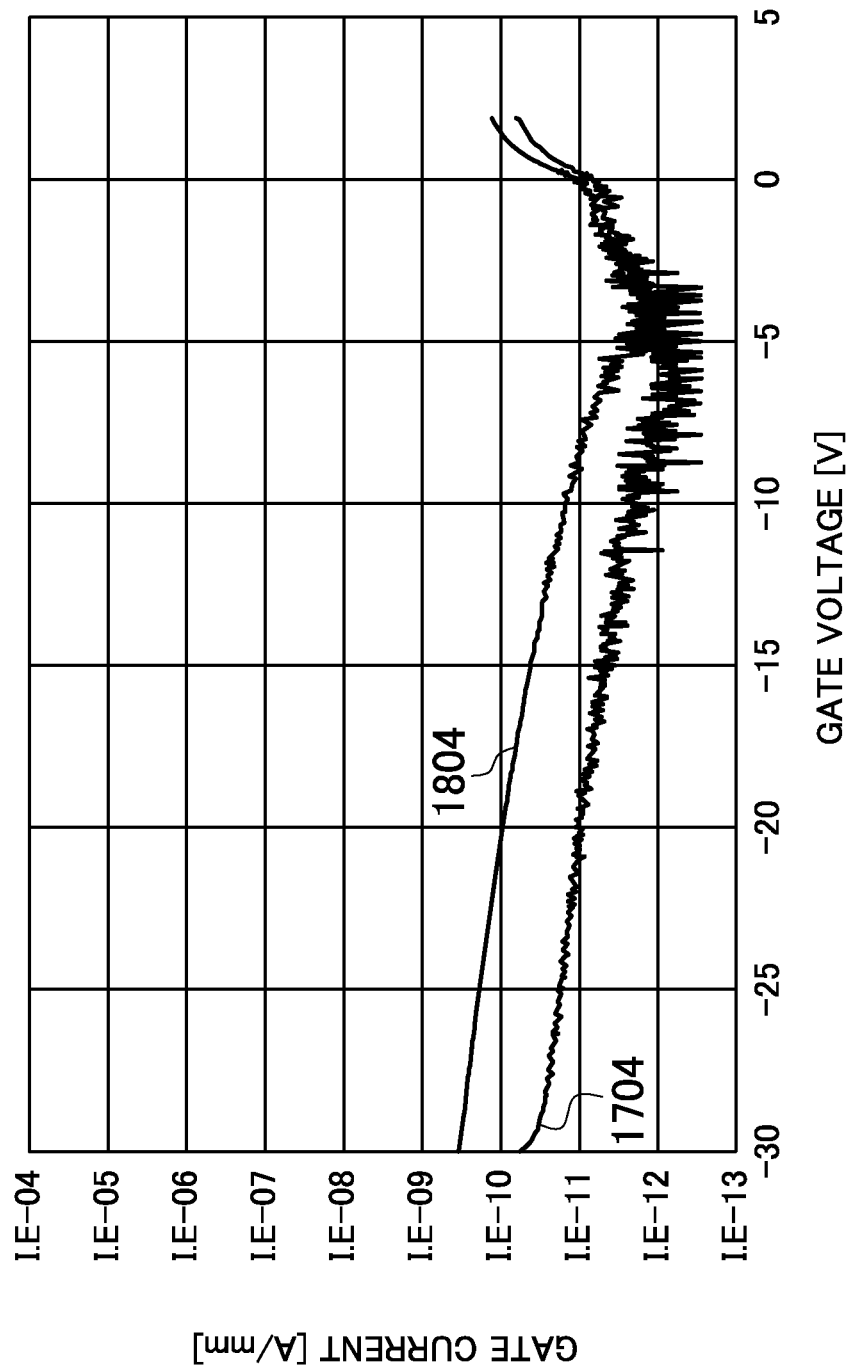
FIG. 18 shows leak current characteristics of the second embodiment and a third embodiment.

FIG. 18 shows gate current characteristics of the HEMTs of the second and third embodiments. In FIG. 18, the vertical axis represents the gate current per 1 mm of gate width [A/mm], and the horizontal axis represents the gate voltage [V]. In FIG. 18, the reference numeral 1704 indicates experimental results of the second embodiment and the reference numeral 1804 indicates experimental results of the third embodiment.

As shown in FIG. 18, the HEMT of the third embodiment also has a gate current held below 500 pA/mm in a gate voltage range from −30 V to 0 V. Furthermore, the gate current is held below 250 pA/mm in a gate voltage range from −25 V to 0 V. As can be seen from FIG. 18, the HEMT of the second embodiment decreases the leak current more than the HEMT of the third embodiment. In the same manner as in the first and second embodiments, the leak current between each pair of a source electrode and a drain electrode in the third embodiment is small enough, relative to the gate current, to be ignored. Therefore, the gate current value can be thought of as being the same as the leak current of the HEMT.

Fourth Embodiment

The HEMT 100 manufactured according to the first embodiment was used to manufacture the switching circuit 1600. The ON resistance value of the HEMT 100 used was no greater than 2 Ωmm. In order to examine characteristics of the switching circuit 1600, the insertion loss of the switching circuit 1600 was measured.

Figure 19:
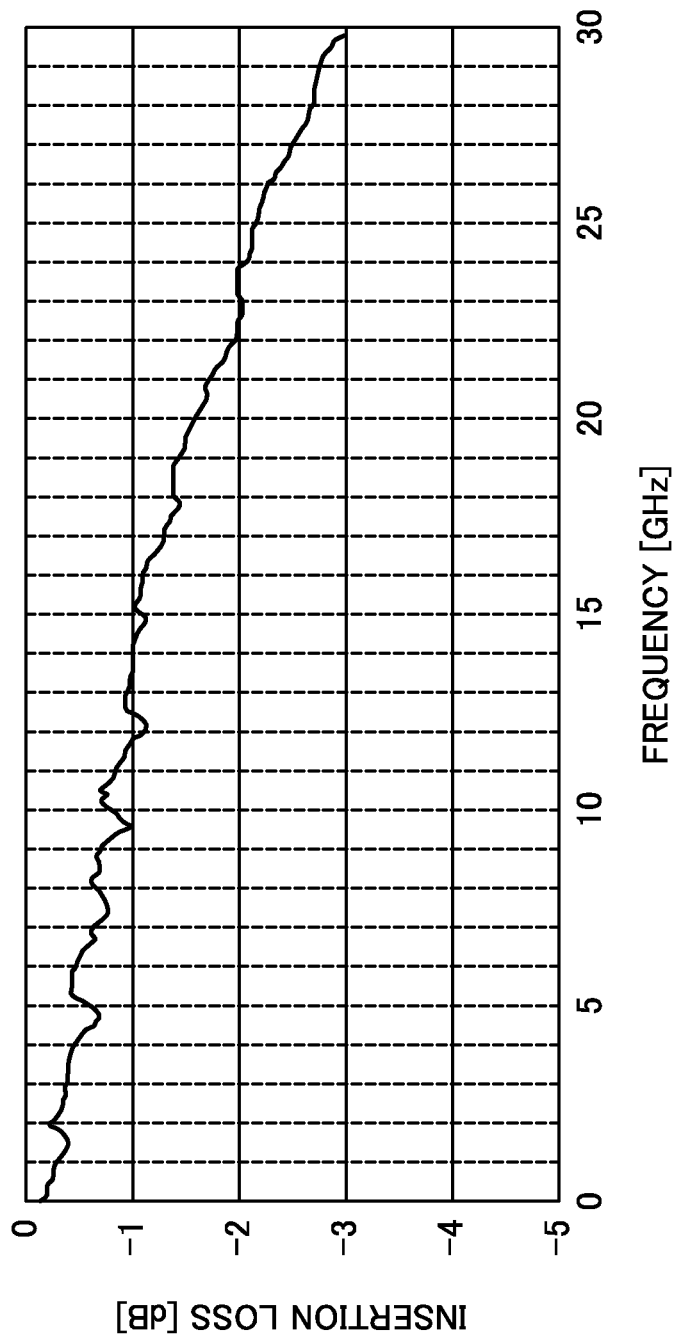
FIG. 19 shows insertion loss characteristics of a fourth embodiment.

FIG. 19 shows a relationship between frequency of an RF signal input from the input terminal 1608 and insertion loss of the switching circuit 1600. In FIG. 19, the vertical axis represents transmission loss [dB] and the vertical axis represents the frequency [GHz] of the RF signal. As shown in FIG. 19, the switching circuit 1600 has an insertion loss of −3 dB or less, even when the frequency of the input signal is 30 GHz. Therefore, by using the semiconductor device having the configuration described above in a switching circuit, the switching circuit can achieve excellent transmission loss characteristics.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor device comprising:
   a plurality of ground side electrodes and a plurality of signal side electrodes arranged on a semiconductor substrate in an alternating manner;
   a plurality of control electrodes arranged respectively between each pair of a ground side electrode and a signal side electrode;
   a ground side electrode connecting section that connects the ground side electrodes to each other;
   a signal side electrode connecting section that connects the signal side electrodes to each other; and
   ground side lead wiring and signal side lead wiring that extend respectively from a region near one end and a region near another end of an arranged electrode section, in which the ground side electrodes and the signal side electrodes are arranged in an arrangement direction, away from the arranged electrode group in the arrangement direction.

2. The semiconductor device according to claim 1, wherein the ground side lead wiring is adjacent to a ground side electrode, from among the plurality of ground side electrodes, that is closest to the ground side lead wiring, and the signal side lead wiring is adjacent to a signal side electrode, from among the plurality of signal side electrodes, that is closest to the signal side lead wiring.

3. The semiconductor device according to claim 1, wherein the ground side electrode connecting section lessens concentration of electric fields in the control electrodes.

4. The semiconductor device according to claim 3, wherein the ground side electrode connecting section has a width greater than a width of the signal side electrode connecting section.

5. The semiconductor device according to claim 3, wherein the ground side electrode connecting section is formed above ends, in a width direction of the control electrodes, of the ground side electrodes, the signal side electrodes, and the control electrodes.

6. The semiconductor device according to claim 5, wherein the ground side electrode connecting section is formed above both ends, in the width direction of the control electrodes, of the ground side electrodes and the signal side electrodes.

7. The semiconductor device according to claim 1, wherein leak current per 1 mm of gate width is no greater than 500 pA, and ON resistance is no greater than 2 Ωmm.

8. A semiconductor device manufacturing method comprising:
   preparing a semiconductor substrate;
   forming, on the semiconductor substrate, a plurality of ground side electrodes and a plurality of signal side electrodes arranged in an alternating manner;
   forming an insulating layer on a surface of the semiconductor substrate, at least in a region between each pair of a ground side electrode and a signal side electrode;
   forming a plurality of control electrodes arranged on the insulating layer respectively between each pair of a ground side electrode and a signal side electrode;
   forming a ground side electrode connecting section that connects the ground side electrodes to each other;
   forming a signal side electrode connecting section that connects the signal side electrodes to each other; and
   forming ground side lead wiring and signal side lead wiring that extend respectively from a region near one end and a region near an other end of an arranged electrode section, in which the ground side electrodes and the signal side electrodes are arranged in an arrangement direction, away from the arranged electrode group in the arrangement direction.

9. A switching circuit comprising a semiconductor device that operates as a switching element, wherein the semiconductor device includes:
   a plurality of ground side electrodes and a plurality of signal side electrodes arranged on a semiconductor substrate in an alternating manner;
   a plurality of control electrodes arranged respectively between each pair of a ground side electrode and a signal side electrode;
   a ground side electrode connecting section that connects the ground side electrodes to each other;
   a signal side electrode connecting section that connects the signal side electrodes to each other; and
   ground side lead wiring and signal side lead wiring that extend respectively from a region near one end and a region near an other end of an arranged electrode section, in which the ground side electrodes and the signal side electrodes are arranged in an arrangement direction, away from the arranged electrode group in the arrangement direction.

* * * * *